United States Patent [19]

Yamazaki

[11] Patent Number: 4,717,941
[45] Date of Patent: * Jan. 5, 1988

[54] SIDEWALL MULTIPLE-GATE IGFET
[75] Inventor: Shunpei Yamazaki, Tokyo, Japan
[73] Assignee: Semiconductor Energy Laboratory Co., Ltd., Tokyo, Japan
[*] Notice: The portion of the term of this patent subsequent to Mar. 3, 2004 has been disclaimed.
[21] Appl. No.: 769,383
[22] Filed: Aug. 26, 1985

Related U.S. Application Data
[62] Division of Ser. No. 304,882, Sep. 23, 1981, Pat. No. 4,654,680.

[30] Foreign Application Priority Data
Sep. 24, 1980 [JP] Japan .................. 55-132528
Sep. 24, 1980 [JP] Japan .................. 55-132529
Sep. 24, 1980 [JP] Japan .................. 55-132530

[51] Int. Cl.$^4$ .............. H01L 29/78; H01L 29/04; H01L 27/04
[52] U.S. Cl. .................. 357/23.3; 357/51; 357/59; 357/23.9; 357/23.14
[58] Field of Search .................. 357/23.11, 23.14, 23.3, 357/51, 59, 48, 23.9

[56] References Cited
U.S. PATENT DOCUMENTS
4,358,340 11/1982 Fu .................. 357/23.3

FOREIGN PATENT DOCUMENTS
55-67166 5/1980 Japan .................. 357/59

Primary Examiner—Andrew J. James
Assistant Examiner—John Lamont
Attorney, Agent, or Firm—Gerald J. Ferguson, Jr.; Michael P. Hoffman; Michael J. Foycik, Jr.

[57] ABSTRACT

A semiconductor device which is provided with a surface channel type or bulk channel type MIS FET. The MIS FET comprises at least a semiconductor substrate of a first conductivity type, a layer member formed in a predetermined pattern on the major surface of the substrate and having an insulating side surface; an insulating layer formed on the major surface of the substrate to extend from the insulating side surface in a direction opposite from the layer member; a conductive layer formed on the major surface of the insulating layer in contact with the insulating side surface of the layer member; and a first semiconductor region of a second conductivity type formed in the semiconductor substrate having a marginal edge corresponding to that of the conductive layer. The first semiconductor region serves as either one of source and drain regions; that region of the semiconductor substrate underlying the conductive layer serves as a channel forming region; that region of the conductive layer facing the channel forming region serves as a gate electrode; and that region of the insulating layer underlying the gate electrode serves as a gate insulating layer. The MIS FET can easily be combined with another MIS FET, a resistance element or capacitance element which is formed through utilization of the layer member of the former.

5 Claims, 89 Drawing Figures

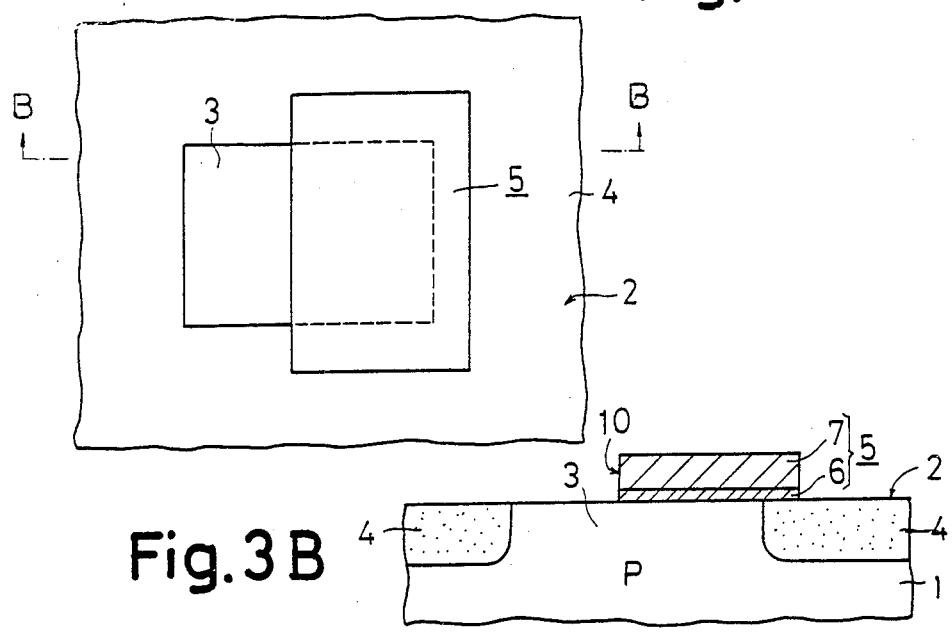
Fig. 3A
Fig. 3B
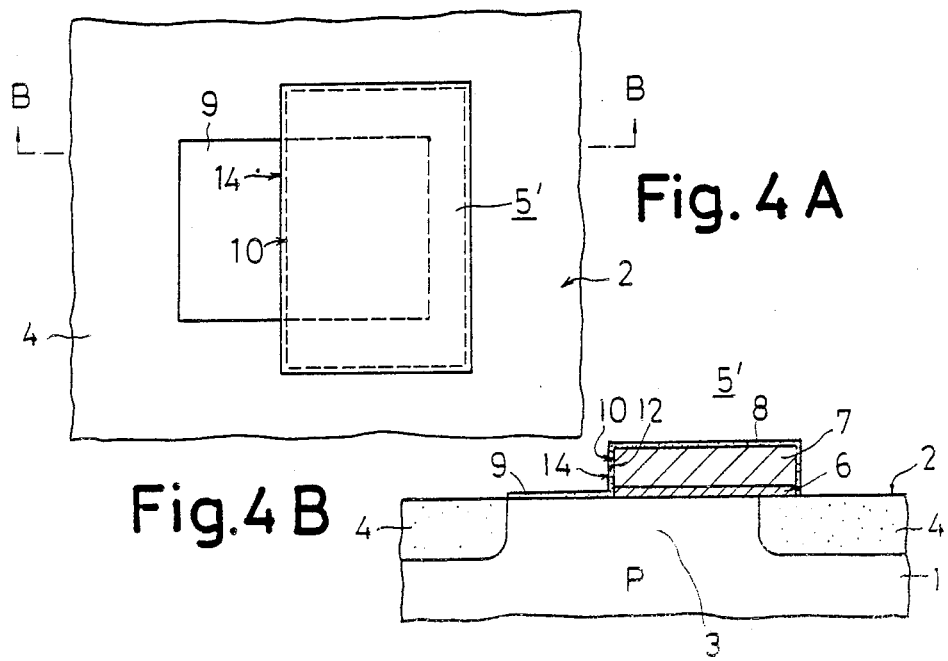
Fig. 4A
Fig. 4B

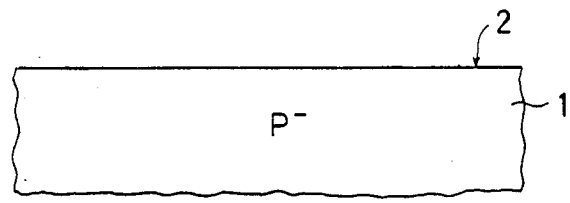
Fig.14
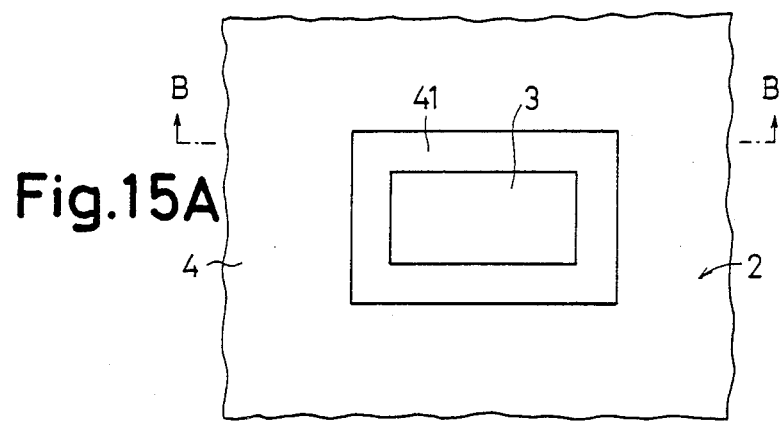
Fig.15A
Fig.15 B
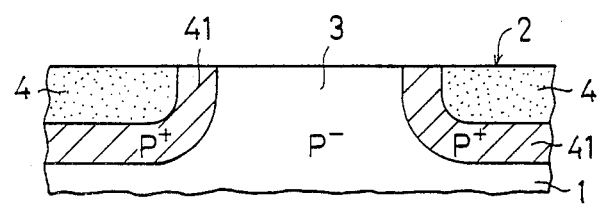
Fig.16
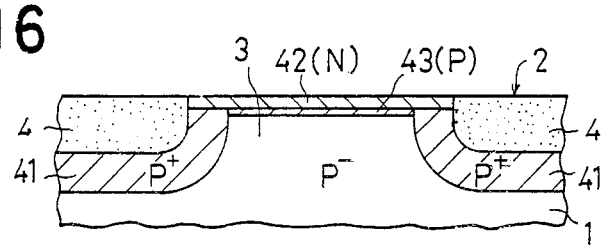

Fig.19
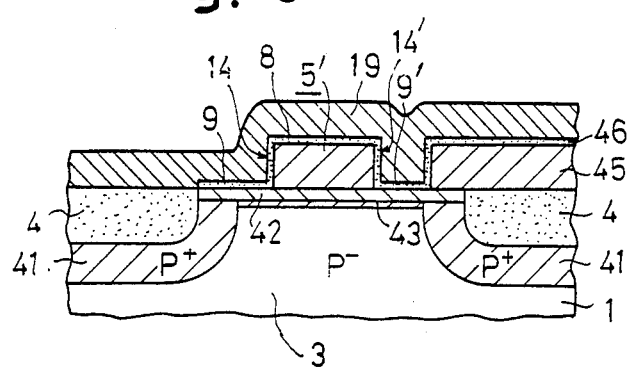
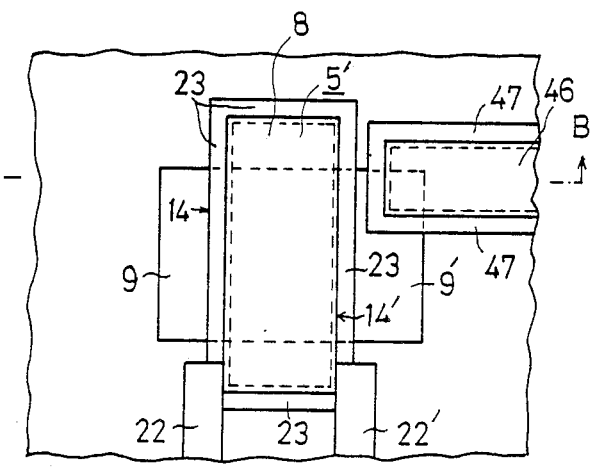
Fig.20A
Fig.20B
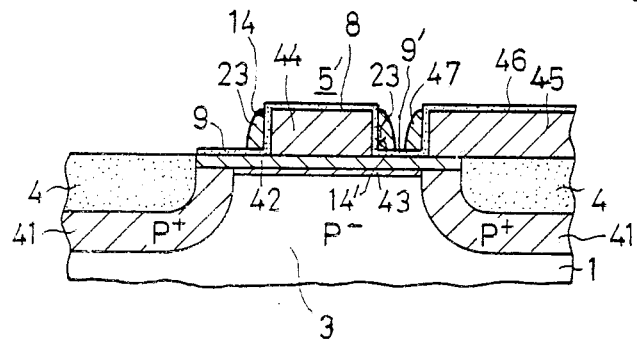

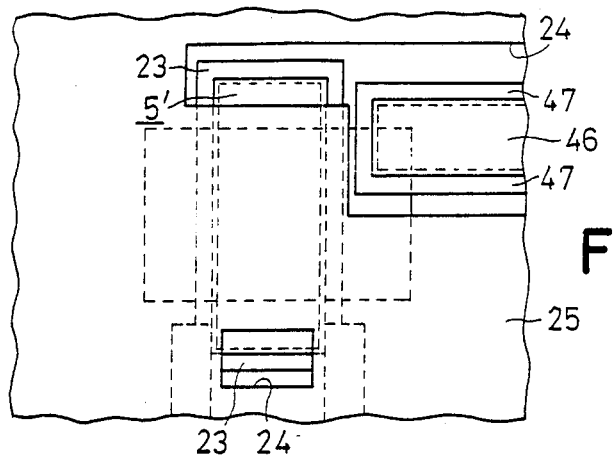
Fig. 21
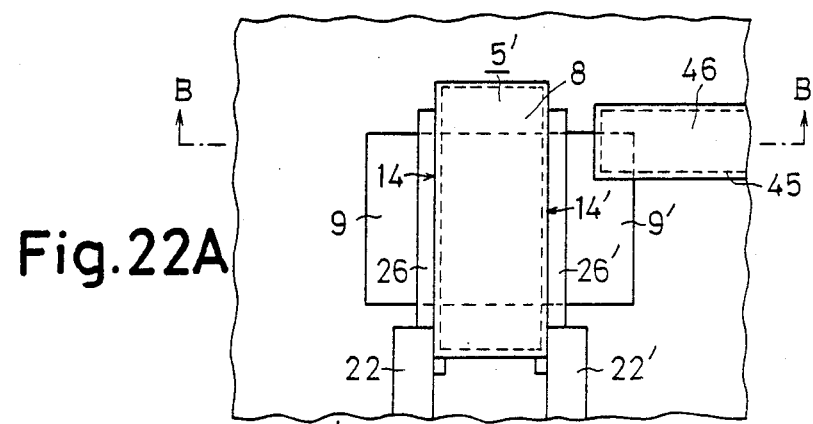
Fig. 22A
Fig. 22B
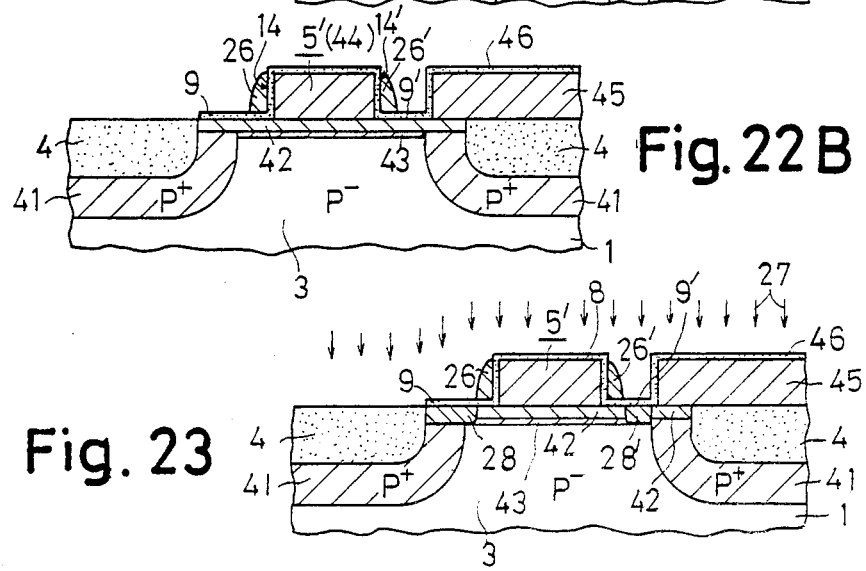
Fig. 23

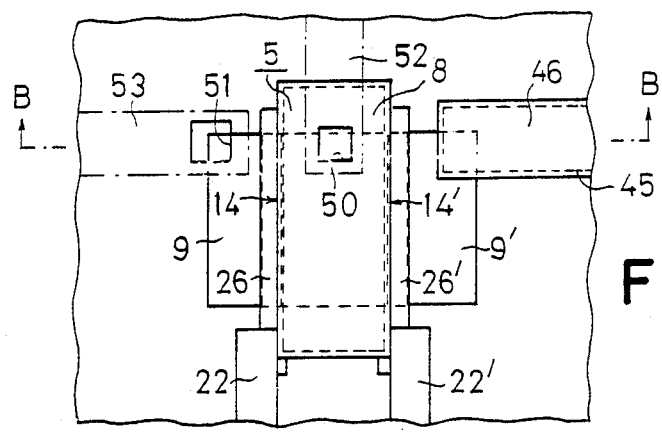
Fig. 26A
Fig. 26B
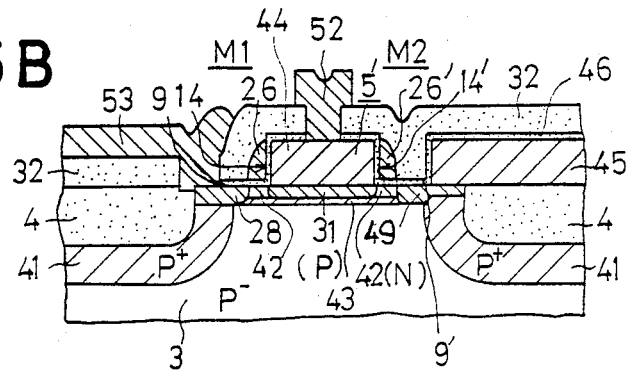
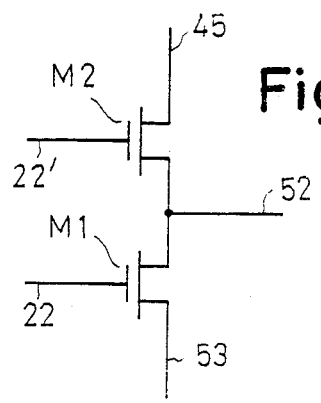
Fig. 27

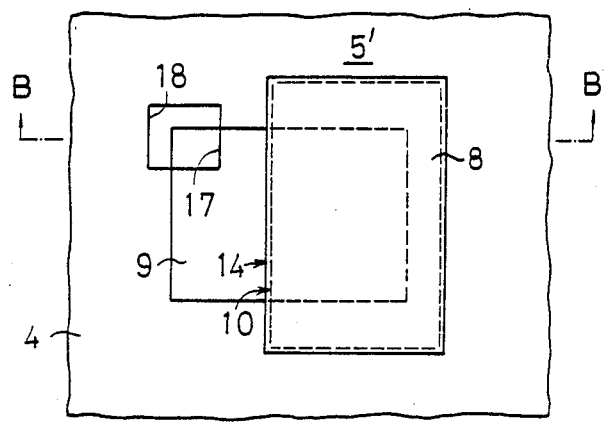
Fig.32A
Fig.32B
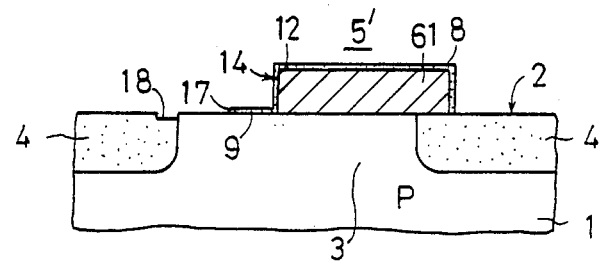
Fig.33
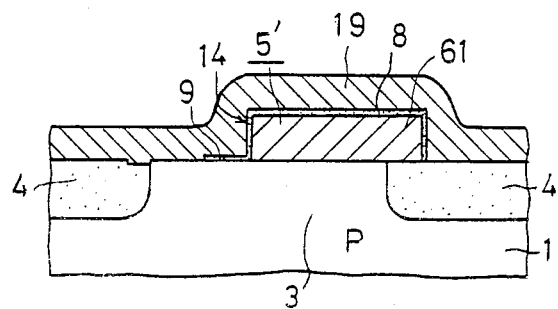

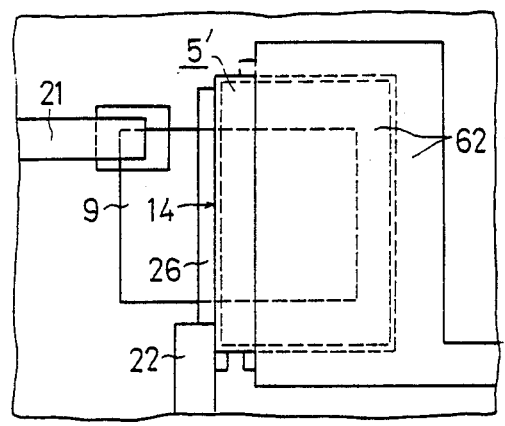
Fig.36
Fig.37
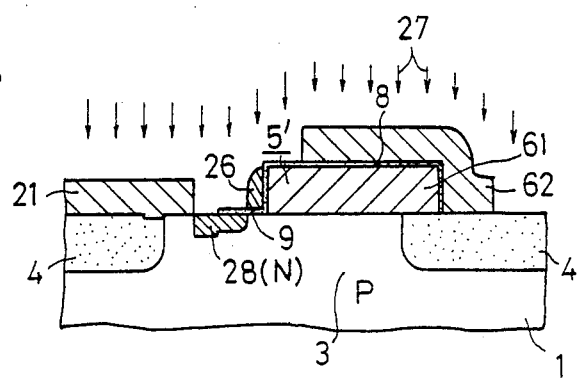
Fig.38
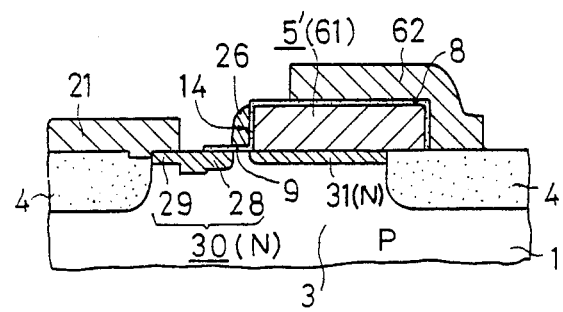

SIDEWALL MULTIPLE-GATE IGFET

This is a divisional application of Ser. No. 304,882, filed Sept. 23, 1981, now U.S. Pat. No. 4,654,680.

BACKGROUND OF THE INVENTION

1. Field of the Invention

The present invention relates to a semiconductor device with an insulated gate field effect transistor and a method of making the same.

2. Description of the Prior Art

Heretofore, there have been proposed a variety of semiconductor devices provided with an insulating gate field effect transistor (hereinafter referred to as an MIS (Metal-Insulator-Semiconductor) FET). The MIS FET is divided into a surface channel type and a bulk channel type.

The surface channel type MIS FET basically has a structure which comprises a semiconductor substrate of a first conductivity type, first and second semiconductor regions of a second conductivity type reverse from the first one and formed in the semiconductor substrate from the side of its major surface, an insulating layer formed on the major surface of the semiconductor substrate to extend over a region between the first and second semiconductor regions, and a conductive layer formed on the insulating layer in opposing relation to that region of the semiconductor substrate defined between the first and second semiconductor regions. In such a surface channel type MIS FET, the first and second semiconductor regions serves as the one and the other of source and drain regions, respectively; the region of the semiconductor substrate defined between the first and second semiconductor regions serves as a channel forming region; that region of the conductive layer confronting the channel forming region serves as a gate electrode; and that region of the insulating layer underlying the gate electrode serves as a gate insulating layer. With the arrangement of the surface channel type MIS FET described above, the ON or OFF state is obtained between the source and drain regions in accordance with a control voltage which is applied across the source region and the gate electrode. The ON or OFF state is dependent on whether or not an inversion layer, that is, a channel is formed in the surface of the channel forming region.

The bulk channel type MIS FET basically has a structure which comprises, by way of example, a semiconductor substrate of a first conductivity type, first and second semiconductor regions of a second conductivity type opposite to the first one and formed in the semiconductor substrate from the side of its major surface, a third semiconductor region formed in the semiconductor substrate from the side of its major surface to extend between the first and second semiconductor regions and having a lower impurity concentration than the first and second semiconductor regions, an insulating layer formed on the third semiconductor region, and a conductive layer formed on the insulating layer in opposing relation to the third semiconductor region. In such a bulk channel type MIS FET, the first and second semiconductor regions serve as the one and the other of source and drain regions, respectively, as in the case of the surface channel type MIS FET; the third semiconductor region serves as a channel forming region; that region of the conductive layer confronting the channel forming region serves as a gate electrode; and that region of the insulating layer underlying the gate electrode serves as a gate insulating layer. With the arrangement of the bulk channel type MIS FET described above, an ON or OFF state is obtained between the source and drain regions in accordance with a control voltage which is applied across the source and drain regions as is the case with the surface channel type MIS FET. This ON or OFF state depends on whether or not a depletion layer formed in the channel forming layer to spread from the side of the gate insulating layer towards the semiconductor substrate reaches the latter.

In either of the surface channel and bulk channel type MIS FETs, it is desirable for a high-speed operation and the reduction of the overall dimensions to decrease the inner spacing of the source and drain regions, thereby to minimize the length of the gate electrode correspondingly.

In the conventional MIS FETs, however, there is a certain limitation on reducing the length of the gate electrode to less than 1 $\mu$m. The reason is as follows: The gate electrode is usually formed by the photoetching method employing a mask. With the photoetching method, it is very difficult to form the gate electrode of a length smaller than its thickness. The length of an ordinary gate electrode is twice to five times larger than its thickness. Accordingly, by forming the gate electrode to a thickness $\frac{1}{2}$ to 1/5 times as large as its length through utilization of the photoetching method, the length of the gate electrode can be reduced smaller than 1 $\mu$m. In such a case however, the gate electrode becomes as thin as $\frac{1}{2}$ to 1/5 $\mu$m, resulting in a large resistance, which is an obstacle to high-speed operations. Thus the prior art has impsoed a certain limitation on reducing the length of the gate electrode down to less than 1 $\mu$m.

Consequently, the prior art MIS FETs have the defect of some limitations on speeding up their operations and reducing their areas.

SUMMARY OF THE INVENTION

Accordingly, it is an object of the present invention to provide a semiconductor device with an MIS FET and a method of making the same which are free from the abovesaid defect of the prior art. According to the present invention, when the MIS FET is the surface channel type, it comprises, for example, a semiconductor substrate of a first conductivity type, a layer member formed in a predetermined pattern on the major surface of the semiconductor substrate and having an insulating side surface; an insulating layer formed on the major surface of the semiconductor substrate to extend from the insulating side surface in a direction opposite from the layer member; a conductive layer formed on the major surface of the insulating layer in contact with the insulating side surface of the layer member; a first semiconductor region of a second conductivity type reverse from the first one, formed in the semiconductor substrate from the side of its major surface, having a marginal edge corresponding to that of the conductive layer on the opposite side from the layer member and extending from the marginal edge to the opposite side from the conductive layer; and a fifth semiconductor region of the second conductivity type formed in the semiconductor substrate to underlie the layer member in contact therewith. In such a surface channel type MIS FET, the first and fifth semiconductor regions serve as the one and the other of source and drain regions; that region of the semiconductor substrate defined between the first and fifth semiconductor regions serves as a channel forming region; that region of the conductive layer facing the channel forming region serves as a gate electrode; and that region of the insulating layer underlying the gate electrode serves as a gate insulating layer. With the arrangement of the surface channel type MIS FET described above, an ON or OFF state is obtained between the source and drain regions in accordance with a control voltage which is applied across the source region and the gate electrode, as is the case with the conventional MIS FET. This ON or OFF state depends on whether or not an inversion layer, that is, a channel is formed in the surface of the channel forming region In the case where the MIS FET is the bulk channel type, it is, for example, identical with the structure of the aforesaid surface channel type MIS FET except that a third semiconductor region of the second conductivity type and having a lower impurity concentration than the first and fifth semiconductor regions is formed in the semiconductor substrate from the side of its major surface to extend between the first and fifth semiconductor regions in contact therewith, and that the conductive layer formed on the insaulting layer has the first conductivity type. In such a bulk channel type MIS FET, the first and fifth semiconductor regions serves as the one and the other of source and drain regions, respectively, the third semiconductor region serves as a channel forming region; that region of the conductive layer confronting the channel forming region serves as a gate electrode; and that region of the insulating layer underlying the gate electrode serves as a gate insulating layer. With the arrangement of the bulk channel type MIS FET described above, as is the case with the prior art MIS FET, an ON or OFF state is obtained between the source and drain regions in accordance with a control voltage which is applied across the source region and the gate electrode. This ON or OFF state depends on whether or not a depletion layer formed in the channel forming region to spread from the side of the gate insulating layer to the semiconductor substrate reaches the latter.

According to either of the surface channel and bulk channel type MIS FETs described above, since the gate electrode has the abovesaid structure, its length can be made sufficiently smaller than in the prior art. That is, the gate electrode can be formed as short as less than 1 $\mu$m, for example. In this case, the thickness of the gate electrode is not limited by its length unlike in the case of the gate electrode of the conventional MIS FET. Accordingly, the gate electrode can be formed sufficiently thick as compared with its length. Therefore, the resistance of the gate electrode can be made sufficiently lower than in the case of the gate electrode of the conventional MIS FET although the length of the gate electrode is sufficiently smaller than in the prior art.

Accordingly, the semiconductor device with an MIS FET according to the present invention possesses the advantage that the MIS FET can be made high-speed in operation and small in size as compared with the conventional MIS FET.

Furthermore, the semiconductor device with an MIS FET according to the present invention has the feature that the MIS FET having the abovesaid advantage can easily be combined with another MIS FET which is formed through utilization of the layer member of the former.

Moreover, the semiconductor device with an MIS FET according to the present invention has the feature that the MIS FET having the abovesaid advantage can easily be combined with a resistance element which is formed through utilization of the layer member of the MIS FET.

In addition, the semiconductor device with an MIS FET has the feature that the MIS FET having the abovesaid advantage can easily be combined with a capacitance element which is formed through utilization of the layer member of the MIS FET.

Other objects, features and advantages of the present invention will become more fully apparent from the following detailed description taken in conjucntion with accompanying drawings.

BRIEF DESCRIPTION OF THE DRAWINGS

FIGS. 1, 2A–2B, 3A–3B, 4A–4B, 5A–5B, 6, 7A–7B, 8–11, and 12A–12B are plan and sectional views schematically illustrating a first embodiment of the present invention as being applied to a semiconductor device provided with a surface channel type MIS FET and resistance element connected therewith and a sequence of steps involved in the manufacture of the semiconductor device;

FIGS. 14 15A–15B, 16, 17A–17B, 18A–18B, 19, 20A–20B, 21, 22A–22B, 23–24, 25A–25B, and 26A–26B are plan and sectional views schematically illustrating a second embodiment of the present invention as being applied to a semiconductor device provided with two bulk channel type MIS FETs and a sequence of steps involved in the manufacture of the semiconductor device;

FIG. 27 is an electrical connection diagram of the second embodiment of the semiconductor device of the present invention;

FIGS. 28, 29A–29B, 30A–30B, 31A–31B, 32A–32B, 33, 34A–34B, 35–38, and 39A–39B are plan and sectional views schematically illustrating a third embodiment of the present invention as being applied to a semiconductor device provided with a surface channel type MIS FET and a capacitance element connected therewith and a sequence of steps involved in the manufacture of the semiconductor device;

DESCRIPTION OF THE PREFERRED EMBODIMENTS

FIGS. 1 to 12 illustrate a first embodiment of the present invention as being applied to a semiconductor device provided with a surface channel type MIS FET and a resistance element and a sequence of steps involved in the manufacture of the semiconductor device.

The first embodiment of the present invention will hereinafter be described in connection with its manufacturing method.

Figure 1:
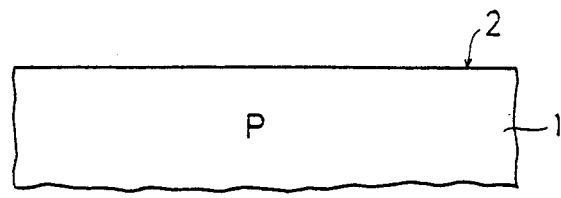

The manufacture starts with the preparation of a semiconductor substrate 1 of a first conductivity type (FIG. 1). In this example the semiconductor substrate 1 is formed of single crystal silicon and has a resistivity of 1 to 5 $\mu$cm and the first conductivity type is P type as shown.

Figure 2A:
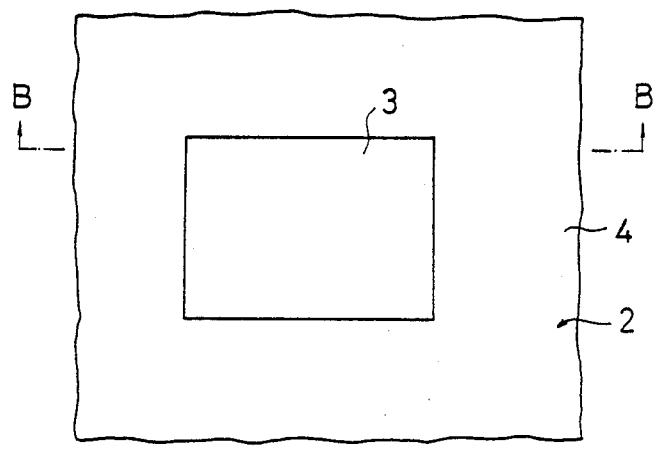

A field insulating layer 4 is formed by a known selective thermal oxidation method to a thickness of, for examaple, 0.3 to 2 $\mu$ in the semiconductor substrate 1 from the side of its flat major surface 2 to provide an element forming region 3 of a square pattern (FIGS. 2A and 2B). In this example, the filed insulating layer 4 is formed of silicon oxide.

Next, a layer member 5 is formed on the major surface 2 of the semiconductor substrate 1 (FIGS. 3A and 3B). In this example the layer member 5 has such a square pattern that it overlies the right half portion of the element forming region 3 and the field insulating layer 4. In this example, the layer member 5 is a laminated member composed of a conductive layer 6 on the side of the semiconductor substrate 1 and a resistance layer 7 formed on the conductive layer 6. The conductive layer 6 is formed of polycrystalline silicon doped with a relatively large quantity of an N type impurity and has a thickness of, for example, 0.05 to 0.2 $\mu$m. The resistance layer 7 is formed of polycrystalline silicon undoped with an impurity or doped with only a small amount of an N type impurity, or polycrystalline silicon having introduced therein 0.5 to 50 mol% of oxygen or nitrogen and undoped with an impurity or doped with a small quantity of an N type impurity, and the resistance layer 7 is, for example, 0.5 to 2 $\mu$m thick. In the case where the resistance layer 7 is formed of the polycrystalline silicon having introduced therein oxygen or nitrogen, it has a resistivity 5 to 50 times higher than in the case where it is formed of the polycrystalline silicon with no oxygen or nitrogen introduced therein. Accordingly, the resistivity of the resistance layer 7 can be raised up to $10^9$ $\Omega$cm. The conductive layer 6 and the resistance layer 7 can be formed by forming a laminated member of polycrystalline silicon layers using a known low-pressure CVD method and by etching the laminated member through a known mask therefor. In the case where the resistance layer 7 is formed of the polycrystalline silicon having introduced therein oxyten or nitrogen, it can be provided by forming a polycrystalline silicon layer by the low-pressure CVD method after the formation of the conductive layer 6 and then introducing oxygen or nitrogen into the polycrystalline silicon layer by a known ion implantation technique. It is desirable that a side surface of the layer member 5 is perpendicular to the major surface 2 of the semiconductor substrate 1. In the case of forming the layer member 5 by the method including the etching process as mentioned above, the etching process may be a plasma etching process. The plasma etching process may be performed by the use of fluorine gas excited by a microwave having a frequency of, for example, 2.45 GHz and, in this case, the fluorine gas is passed in a direction perpendicular to the major surface 2 of the semiconductor substrate 1. By such a plasma etching process, the side surface of the layer member 5 can be formed perpendicular to the major surface 2 of the semiconductor substrate 1.

Next, an insulating layer 8 is formed over the entire area of the exterior surface of the layer member 5 and, at the same time, an insulating layer 9 is formed all over the area of the region 3 of the semiconductor substrate 1 which is not covered with the layer member 5 (FIGS. 4A and 4B). These insulating layers 8 and 9 can be formed by nitrification of the layer member 5 and the region 3. This nitrification can be conducted by a known high-pressure nitrification method which employs an ammonia gas atmosphere having a temperature of 900° to 1100° C. and pressurized up to 5 to 10 atmospheric pressures. Also the nitrification may be performed by a known method which employs an ionized ammonia gas or nitrogen gas atmosphere while heating the semiconductor substrate 1 up to 500° to 1100° C. In the case where the insulating layers 8 and 9 are provided by the abovesaid nitrification method, they are formed of silicon nitride. The insulating layers 8 and 9 may be made 50 to 200 Å thick. These insulating layers 8 and 9 may also be formed of silicon oxide by the employment of a known oxidation technique for the layer member 5 and the region 3. Moreover, insulating layers 8 and 9 may also be formed by depositing various semiconductor materials through the use of a known CVD method, vacuum exaporation method or the like. Thus a layer member 5' is formed including the conductive layer 6, the resistance layer 7 formed thereon and an insulating layer 12 formed in contact with a side surface 10 of the conductive layer 6 and the resistance layer 7 on the side of the region 3, the surface of the insulating layer 12 forming an insulating side surface 14 of the layer member 5'. The insulating layer 9 is formed to extend from the insulating side surface 14 of the layer member 5' in a direction opposite therefrom.

Figure 5A:
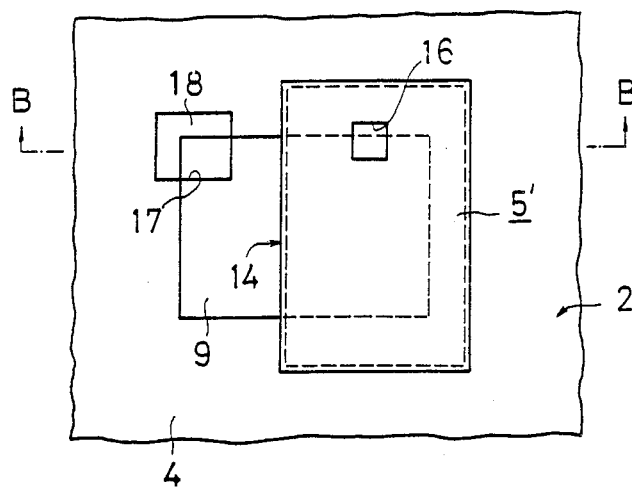
Figure 5B:
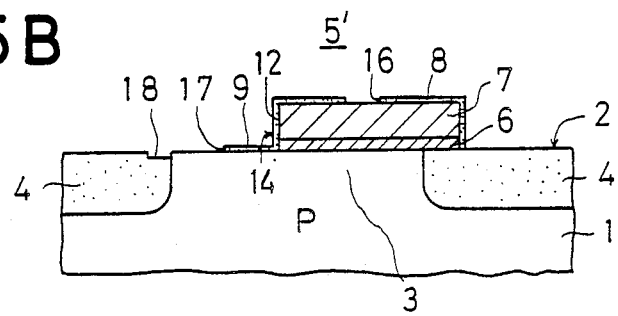

Then, that region of the insulating layer 8 overlying the resistance layer 7 is selectively removed to form a window 16 to expose therethrough the resistance layer 7 to the outside and the insulating layer 9 is also selectively removed, for example, at its one corner to form a window 17, exposing the region 3 to the outside FIGS. 5A and 5B). These windows 16 and 17 can be provided by a known plasma etching method using a mask. For the plasma etching in this case, CF$_4$ gas plasma may be employed The field insulating layer 4 is shown to have a recess 18 contigueous to the window 17. The recess 18 is made in the case where the windows 16 and 17 are formed by the plasma etching technique.

Figure 6:
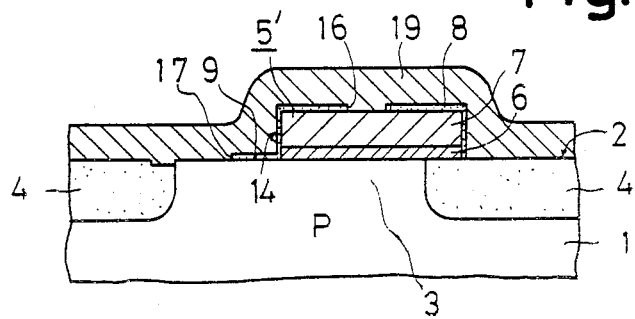

Next, a conductive layer 19 is formed over the entire exterior surfaces of the layer member 5' and the insulating layer 9, the entire surface of the region 3 defining the window 17 and the field insulating layer 4 (FIG. 6). In this example, the conductive layer 19 is formed of polycrystalline silicon doped with a large quantity of an N type impurities. The conductive layer 19 can be provided by the known low-pressure CVD method. In this case, it must be noted that the thickness of the conductive layer 19 on the insulating side surface 14 of the layer member 5' in a direction perpendicular to the major surface 2 of the semiconductor substrate 1 is, for example, twice to five times larger than the thickness of the other portions, and that the thickness on the side surface 14 of the layer member 5 is, for example, 0.10 to 1.5 $\mu$m large enough to gradually decrease in a direction opposite from the layer member 5'.

Figure 7A:
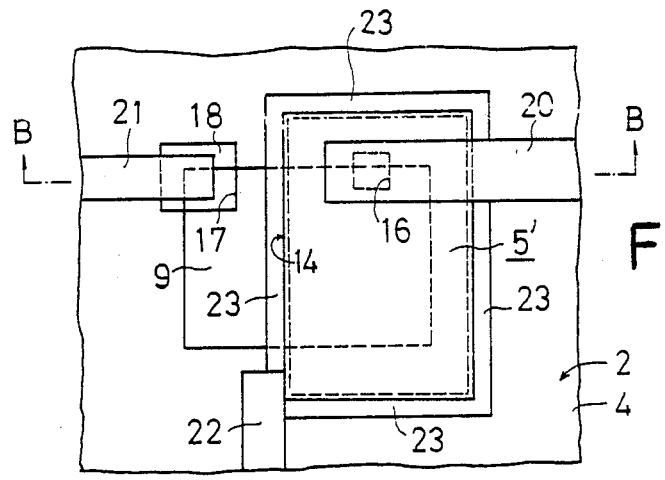
Figure 7B:
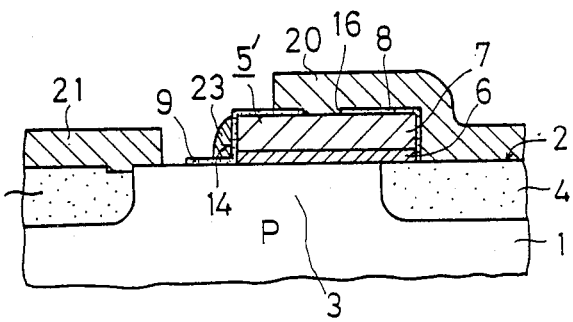
Figure 8:
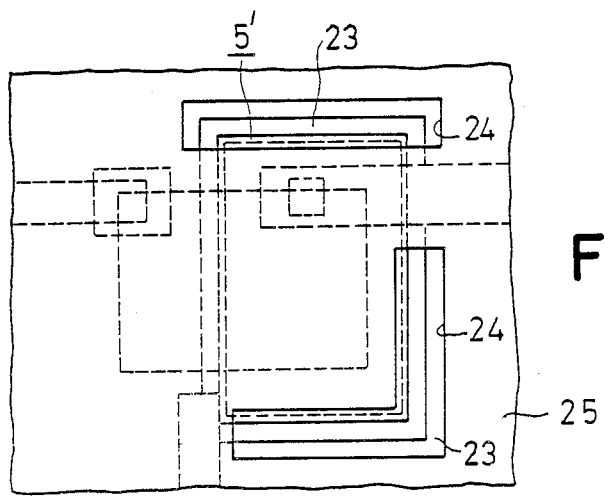

Next, the conductive layer 19 is selectively etched away using a mask to form a conductive layer 20 of a striped pattern which makes ohmic contact with the resistance layer 7 through the window 16 and extend on the insulating layers 8 and 4 in a direction opposite from the side surface 14 of the layer member 5', a conductive layer of a striped pattern which is coupled with the region 3 through the window 17 and extends on the insulating layer 4 in the direction opposite from the layer member 5' and a conductive layer 22 of a striped pattern which extends from a corner of the layer member 5' in the direction opposite from the layer member 5' (FIG. 7A and 7B). The mask used in this etching process, though not shown, has patterns corresponding to the patterns of the conductive layers 20, 21 and 22. The etching process in this case should be substantially free from so-called side ethcing and taper etching of the conductive layer 19. This can be achieved by such a method in which a reactive gas for etching, activated by a microwave having, for example, a 2.45 GHz frequency, such as nitrogen fluoride (NF$_3$) gas, CF$_4$ gas or the like, is supplied in a direction perpendicular to the major surface 2 of the semiconductor substrate 1 in a vacuum atmosphere of 0.001 to 0.1 Torr, in particular, 0.01 to 0.5 Torr. In such a case, since the thickness of the conductive layer 19 on the side surface of the layer member 5' in the direction perpendicular to the major surface 2 of the semiconductor substrate 1 is larger than the thickness of the other portions and gradually decreases in the direction opposite from the layer member 5' as mentioned above, there is left on the side surface of the layer member 5' a conductive layer 23 which is substantially triangular in longitudinal section and connected with the conductive layers 22 and 20. The base of the triangle of the conductive layer 23 is 0.05 to 0.1 $\mu$m long, typically 0.1 to 0.5 $\mu$m and its height is 0 3 to 2.5 $\mu$m, typically 0.4 to 0.8 $\mu$m.

Thereafter, the conductive layer 23 is selectively removed by the known etching technique using a mask 25 (FIG. 8) having an opening 24 for exposing the conductive layer 23 to the outside at a position except the region extending on the insulating layer 9 and the region defined between the abovesaid region and the conductive layer 22, after which the mask 25 is removed (FIG. 9), thus providing a conductive layer 26 connected with the conductive layer 22 alone.

Figure 10:
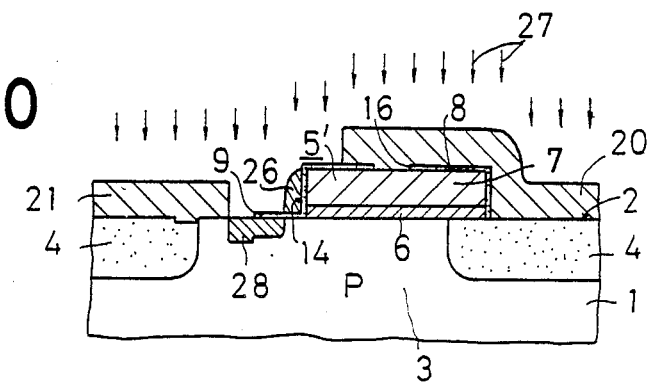

Following this, ions 27 of a N type impurity are implanted into the region 3 of the semiconductor substrate 1 using the layer member 5' and the conductive layers 21 and 26 as masks. As a result of this, there is formed in the region 3 of the semiconductor substrate 1 as N type semiconductor region 28 from the side of the major surface 2 of the substrate 1, which region has a marginal edge corresponding to that of the conductive layer 26 on the opposite side from the layer member 5' and extends from the marginal edge in a direction opposite from the conductive layer 26 (FIG. 10). It must be noted here that the marginal edge of the semiconductor region 28 on the side of the conductive layer 26 is formed by so-called self alignment of the layer 26.

Figure 11:
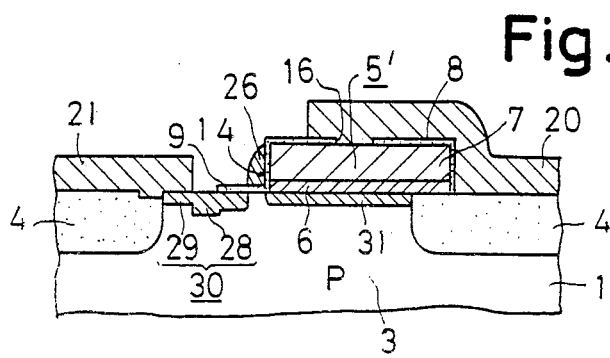

The formation of the semiconductor region 28 is followed a heat treatment by which the N type impurity contained in the conductive layer 21 is diffused into the underlying portion of the region 3 to form an N type semiconductor region 29 in contact with the semiconductor region 28 and the conductive layer 21, thus providing a semiconductor region 30 composed of the semiconductor regions 28 and 29. At the same time, the N type impurity contained in the conductive layer 6 is diffused by the heat treatment into the portion of the region 3 underlying the conductive layer 6 of the layer member 5' to form an N type semiconductor region 31 contiguous to the conductive layer 6 (FIG. 11). In this case, it must be noted that a marginal edge of the semiconductor region 31 on the side of the conductive layer 26 corresponds to its marginal edge on the side of the layer member 5'.

Figure 12A:
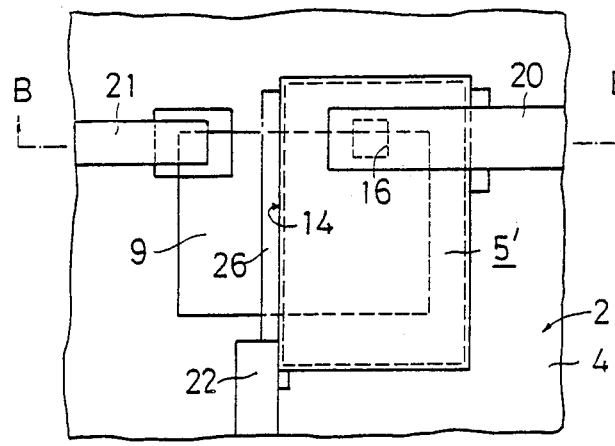
Figure 12B:
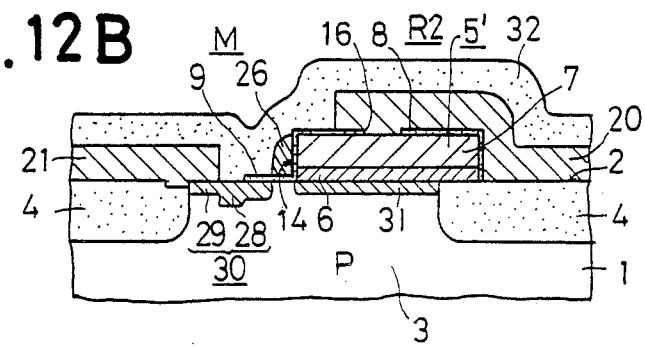

Thereafter, an insulating layer 32 is formed as by the known CVD method to cover the conductive layers 21, 22 and 26 (FIGS. 12A and 12B but in FIG. 12A the insulating layer 32 is shown to be removed).

In this way, there is obtained the structure of the first embodiment of the semiconductor device with the surface channel type MIS FET and the resistance element according to the present invention.

Figure 13:
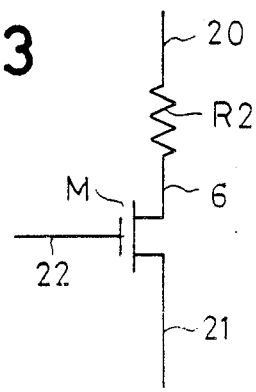
FIG. 13 is an electrical connection diagram of the first embodiment of the semiconductor device of the present invention.

According to the arrangement of the first embodiment of the present invention, the surface channel type MIS FET, indicated generally by M, is constituted which uses the semiconductor regions 30 and 31 as the one and the other of its source and drain regions (For the sake of brevity, the semiconductor regions 30 and 31 will hereinafter be referred to as the source and drain regions, respecitvely), the region of the semiconductor substrate 1 defined between the semiconductor regions 30 and 31 as its channel forming region, the region of the conductive layer 26 confronting the channel forming region as its gate electrode and the region of the insulating layer 9 underlying the gate electrode as its gate insulating layer. Further, the resistance layer 7 of the layer member 5' constitutes a resistance element R2 which is connected between the drain region of the MIS FET M and the conductive layer 20 with the conductive layer 6 interposed therebetween. Accordingly, the MIS FET M and the resistance element R2 are connected in series with each other as depicted in FIG. 13. When applying a control voltage across the source region and gate electrode via the conductive layers 21 and 22, the MIS FET M is turned ON or OFF between the source and drain regions and consequently the conductive layers 20 and 21 in accordance with the applied voltage. This ON or OFF state depends on whether or not an inversion layer, that is, a channel is formed in the surface of the channel forming region.

According to the first embodiment of the semiconductor device of the present invention, the conductive layer 26 is formed on the surface of the insulating layer 9 in contact with the insulating side surface 14 of the layer member 5'. Accordingly, the length of the gate electrode can be reduced down to less than 1 $\mu$m. Further, the thickness of the gate electrode can be made large as compared with its length and, consequently, the resistance of the gate electrode can be decreased sufficiently low. In addition, since the channel forming region is short corresponding to the small length of the gate electrode, the MIS FET can be made small in size. Moreover, even if the gate electrode is made thick as compared with its length, it is mechanically strong and stable because it is formed in contact with the side surface 14 of the layer member 5'. The layer member 5' producing such an effect includes the resistance layer 7, which constitutes the resistance element R2. Therefore, the structure of series connection of the MIS FET M and the resistance element R2 can easily be obtained in a small size.

Turning next to FIGS. 14 to 26, a second embodiment of the present invention will be described as being applied to a semiconductor device provided with two bulk channel type MIS FETs. The following description will be given in order of steps involved in the manufacture of the second embodiment.

In FIGS. 14 to 26, the parts corresponding to those in FIGS. 1 to 12 are identified by the same reference numerals and no detailed description will be repeated.

The manufacture starts with the preparation of the same semiconductor substrate 1 as in the case of FIG. 1 (FIG. 14), but this substrate 1 is P$^-$ type.

Figure 2:
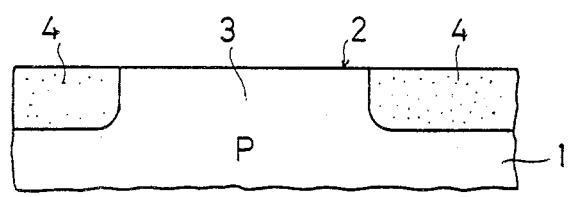

Next, the same field insulating layer 4 as in the case of FIG. 2 is formed by the selective oxidation technique in the semiconductor substrate 1 from the side of its major surface 2 so as to provide the element forming region 3 (FIG. 15). In this case, a P$^+$ type semiconductor region 41 is formed around the insulating layer 4 in the element forming region 3 using an atmosphere containing an P type impurity, for example, boron.

Thereafter, an N type semiconductor region 42 which is in contact with the insulating layer 4 on all sides on the side of the major surface 2 of the semiconductor substrate 1 and a P type semiconductor region 43 which underlies the semiconductor region 42 and is in contact with the semiconductor region 41 are formed in the element forming region 3 (FIG. 16). These semiconductor regions 42 and 43 can be provided by introducing a P type impurity and N type impurity into the region 3 respectively.

Figure 17A:
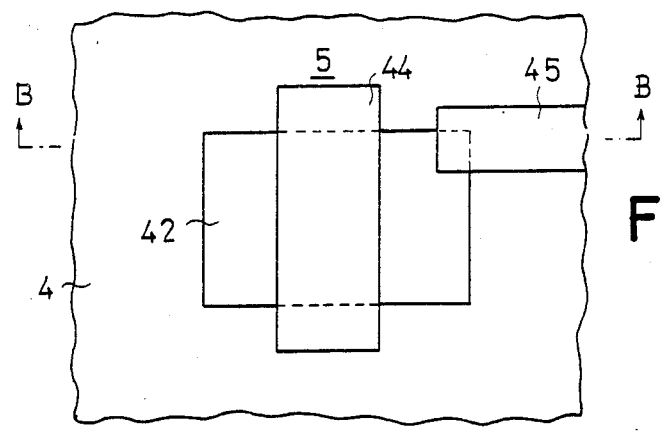
Figure 17B:
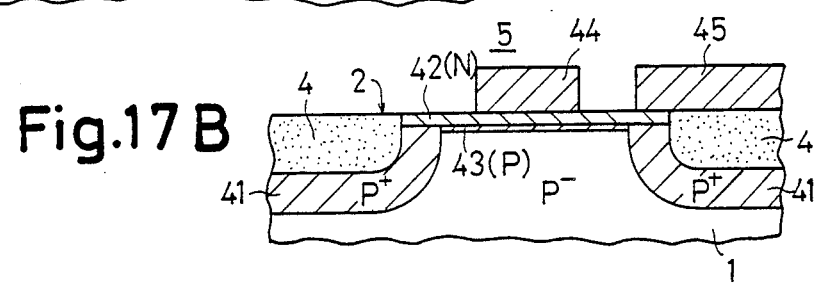

Following this, the same layer member 5 as in the case of FIG. 3 is formed on the major surface 2 of the semiconductor substrate 1 (FIGS. 17A and 17B). In this example, however, the layer member 5 extends on the region 3 to divide it into two. The layer member 5 is formed by a conductive layer 44, which is formed of polycrystalline silicon doped with a relatively large amount of an N type impurity. The conductive layer 44 can be obtained by the same method as is employed for the formation of the conductive layer 6 in the case of FIG. 3. Simultaneously with the formation of the conductive layer 44, a similar conductive layer 45 is formed which is made of polycrystalline silicon doped with an N type impurity. The conductive layer 45 extends in a striped pattern from a corner of the region 3 to the opposite side from the conductive layer 44.

Figure 18A:
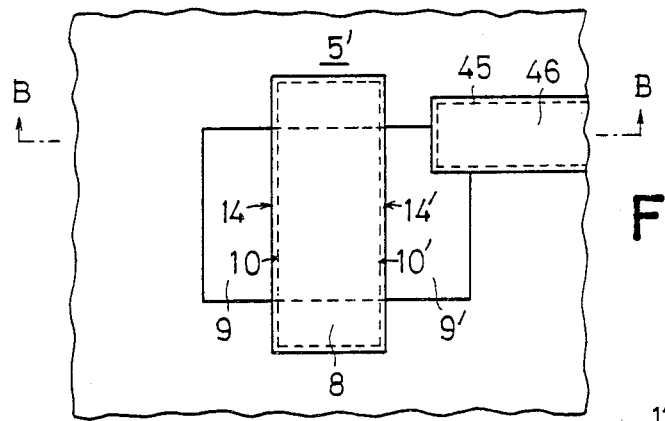
Figure 18B:
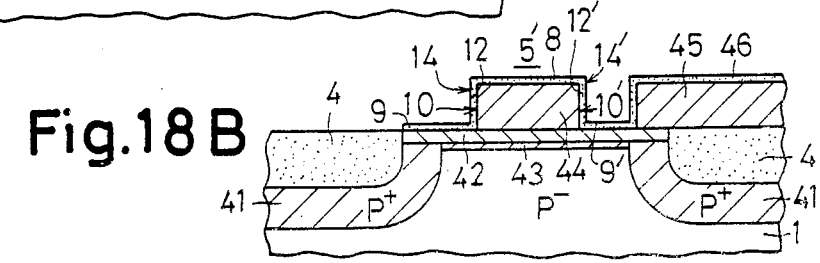

Then, the same insualting layers 8 and 9 as in the case of FIG. 4 are formed on the entire exterior surface of the layer member 5 and the area of the region 3 which are not covered with the layer member 5 and the conductive layer 45 (FIGS. 18A and 18B). Simultaneously with the formation of the insulating layers 8 and 9, a similar insulating layer 46 is formed all over the exterior surface of the conductive layer 45. In this way, a layer member 5' is formed which includes the conductive layer 45 and insulating layers 12 and 12' formed on its opposite side surfaces 10 and 10', respectively, and uses the surfaces of the insulating layers 12 and 12' as its insulating side surfaces 14 and 14', respectively. The insulating layer 9 is obtained as insulating layers 9 and 9' which extend from the side surfaces 14 and 14' of the layer member 5' in directions opposite from the layer member 5', respectively.

Next, the same conductive layer 19 as in the case of FIG. 6 is formed all over the surfaces of the layer member 5', the insulating layers 9, 9' and 46 and the field insulating layer 4 (FIG. 19). In this example, however, the conductive layer 19 is formed of polycrystalline silicon doped with a P type impurity.

Following this, the conductive layer 19 is selectively etched away using a mask similar to that employed in the case of FIG. 7, forming the conductive layer 22 similar to that obtained in the case of FIG. 7 and a similar conductive layer 22' extending from another corner of the layer member 5' (FIG. 20). In this case, there are left on the side surfaces of the layer member 5' the conductive layers 23 coupled with the conductive layers 22 and 22', respectively, as in the case of FIG. 7. A similar conductive layer 47 is also left on the region of the insulating layer 46 covering the side surface of the conductive layer 45.

Thereafter, the conductive layers 23 and 47 are selectively etched away through the use of a mask 25 (FIG. 21) having openings 24 for exposing the conductive layer 23 to the outside at a position other than the regions extending on the insulating layers 9 and 9' and the regions defined between such regions and the conductive layers 22 and 22' and for exposing the conductive layer 47 to the outside. After this selective etching, the mask 25 is removed (FIG. 22), providing conductive layers 26 and 26' connected with the conductive layers 22 and 22', respectively.

Next, N type impurity ions 27 are implanted into the semiconductor region 42 formed in the region 3 of the semiconductor substrate 1 using the layer member 5' and the conductive layer 45 as masks, by which an N$^+$ type semiconductor region 28 similar to that in the case of FIG. 10 and similar to N$^+$ type semiconductor region 28' are simultaneously formed (FIG. 23). In this case, the semiconductor region 28' has a marginal edge corresponding to that of the conductive layer 26' and extends in a direction opposite therefrom.

Figure 24:
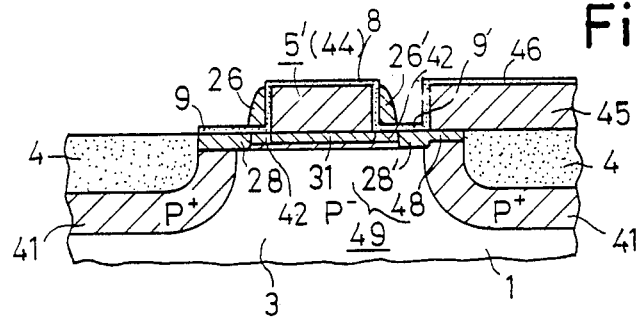

Next, the substrate assembly is subjected to heat treatment, by which an N type impurity contained in the conductive layer 44 is introduced into the semiconductor region 42 underlying the layer member 5' to form an N+ type semiconductor region 31 similar to that in the case of FIG. 11 and, at the same time, an N type impurity contained in the conductive layer 45 is introduced into the portion of the semiconductor region 42 underlying the conductive layer 45 to form an N+ type semiconductor region 48 contiguous to the semiconductor region 28' and the conductive layer 45, providing an N+ type semiconductor region 49 composed of the semiconductor regions 28' and 48 (FIG. 24).

Figure 25A:
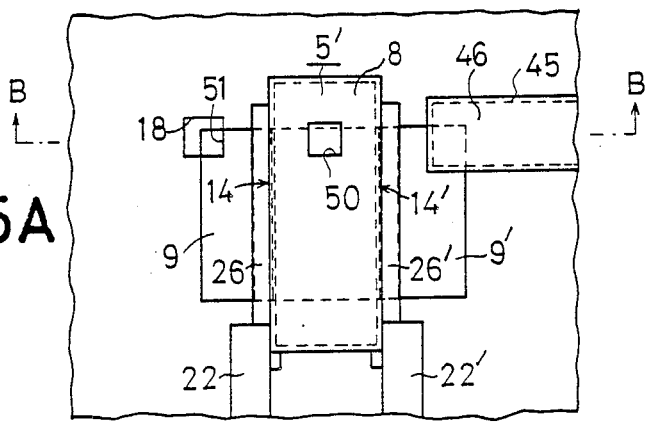
Figure 25B:
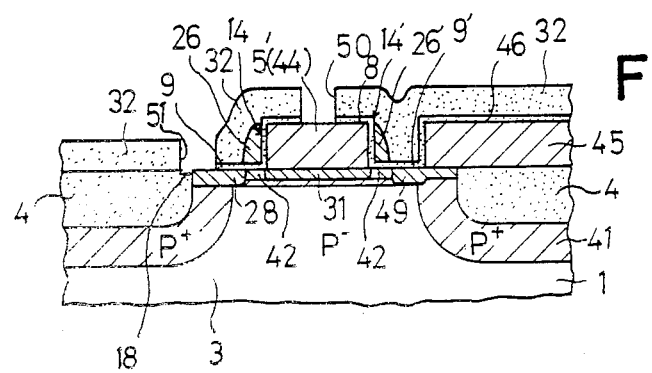

After this, the same insulating layer 32 as in the case of FIG. 12 is formed to cover the conductive layers 26 and 26' and the insulating layers 23 and 8 are selectively removed to form a window 50 for exposing therethrough the conductive layer 44 of the layer member 5' to the outside and, at the same time, the insulating layers 32 and 9 are selectively removed to form a window 51 for exposing therethrough the semiconductor region 28 to the outside (FIGS. 25A and 25B but in FIG. 25A the insulating layer 32 is omitted). In this case, the same recess 18 as in the case of FIG. 5 is formed in the insulating layer 4. Finally, conductive layers 52 and 53 which are coupled with the conductive layer 44 and the semiconductor region 28 through the windows 50 and 51, respectively are formed by a known method on the insulating layer 32 (FIGS. 26A and 26B (In FIG. 26A the insulating layer 32 is omitted)).

Thus the structure of the second embodiment of the semiconductor device is obtained which is provided with two bulk channel type MIS FETs.

With the arrangement of the second embodiment of the present invention, the bulk channel type MIS FET M1 is constituted in which the semiconductor regions 28 and 31 serve as, for example, source and drain regions, respectively; the portion of the semiconductor region 42 defined between the semiconductor regions 28 and 31 serves as a channel forming region; the region of the conductive layer 26 confronting the channel forming region serves as a gate electrode; and the region of the insulating layer 9 underlying the gate electrode serves as a gate insulating layer. Further, there is constituted another bulk channel type MIS FET M2 in which the semiconductor regions 31 and 49 serve as source and drain regions; the portion of the semiconductor region 42 defined between the semiconductor regions 31 and 49 serves as a channel forming region; the region of the conductive layer 26' confronting the channel forming region serves as a gate electrode; and the region of the insulating layer 9' underlying the gate electrode serves as a gate insulating layer. Accordingly, the second embodiment of the semiconductor device of the present invention has the structure in which the MIS FETs M1 and M2 are connected in series with each other as depicted in FIG. 27. In the MIS FETs M1 and M2, when a control voltage is applied across the source region and gate electrode (via the conductive layers 53 and 22 in the case of the MIS FET M1 and via the conductive layers 53 and 22' in the case of the MIS FET M2), an ON or OFF state is obtained between the source and drain regions (and consequently between the conductive layers 53 and 52 in the case of the MIS FET M1 and between the conductive layers 45 and 52 in the case of the MIS FET M2). This ON or OFF state is dependent on whether or not a depletion layer spreading in the channel forming region from the side of the gate insulating layer reaches the semiconductor region 43.

The second embodiment of the present invention has the structure in which the conductive layers 26 and 26' are formed on the surfaces of the insulating layers 9 and 9', respectively, and in contact with the insulating side surfaces 14 and 14' of the layer member 5' as is the case with the first embodiment. Accordingly, the lengths of the gate electrodes of the MIS FETs M1 and M2 can be made small and and the gate electrodes can be formed thick. Therefore, the MIS FETs M1 and M2 can be made high-speed in operation and formed small in sizd as is the case with the first embodiment. The gate electrodes of the both MIS FETs M1 and M2 are mechanically strong and stable. The series-connected structure of the two MIS FETs M1 and M2 can be formed easily and small in size through utilization of the layer member 5' common to them.

A description will be given, with reference to FIGS. 28 to 39, of a third embodiment of the present invention as being applied to a semiconductor device provided with one surface channel type MIS FET and one capacitance element. The description will be made following a sequence of steps utilized in the fabrication of the semiconductor device.

In FIGS. 28 to 39, the parts corresponding to those in FIGS. 1 to 12 are marked with the same reference numerals and no detailed description will be repeated.

Figure 28:
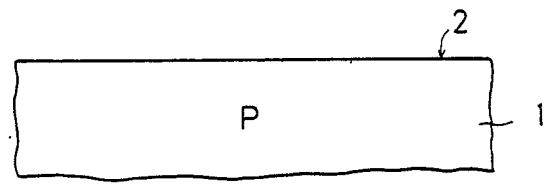

The manufacture starts with the preparation of the semiconductor substrate 1 similar to that in FIG. 1 (FIG. 28).

Figure 29A:
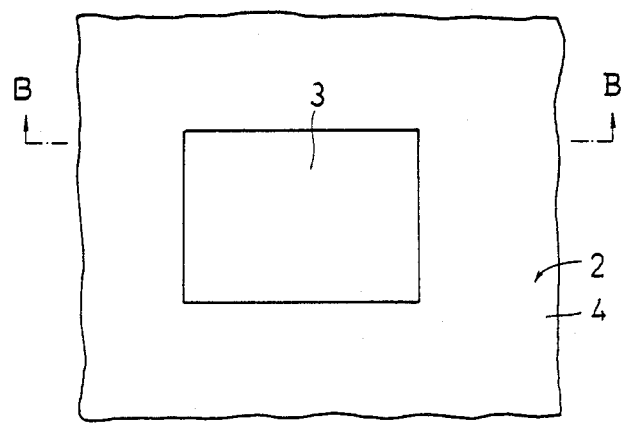
Figure 29B:
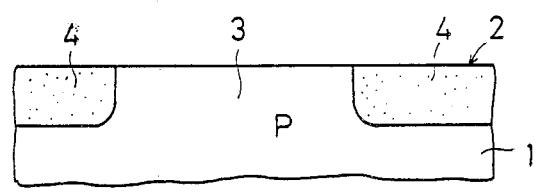

The next step is to form the field insulating layer 4 in the semiconductor substrate 1 from the side of its major surface 2 so as to form the element forming region 3 as in the case of FIG. 2 (FIGS. 29A and 29B).

Figure 30A:
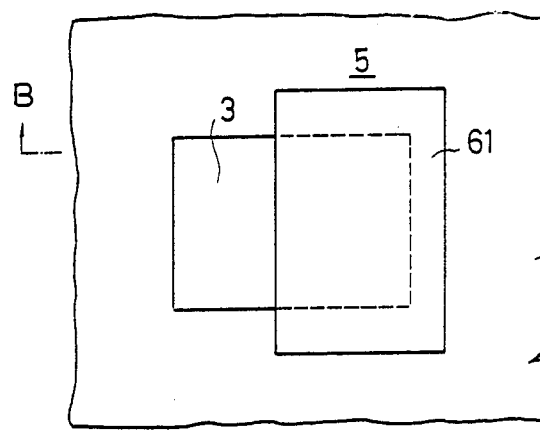
Figure 30B:
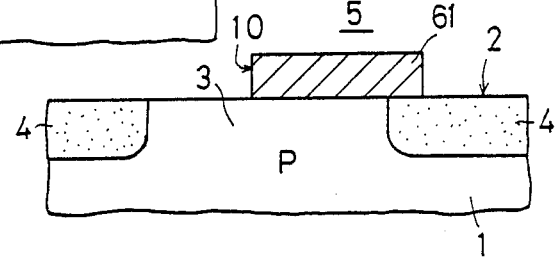

After this, the layer member 5 similar to that in the case of FIG. 3 is formed on the major surface 2 of the semiconductor substrate 1 (FIG. 30). In this example, however, the layer member 5 is formed by a conductive layer 61 similar to that 6 in FIG. 3.

Figure 31A:
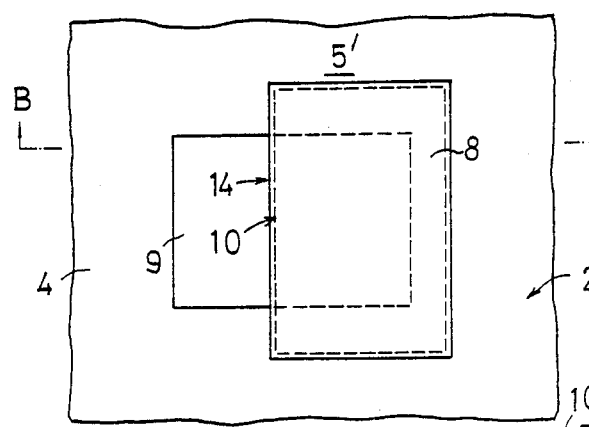
Figure 31B:
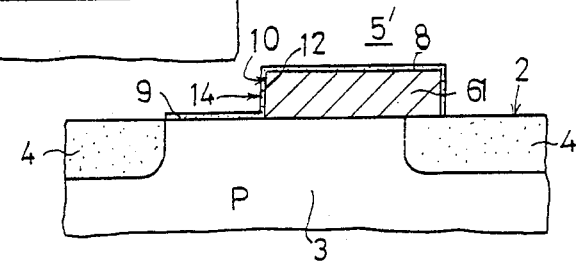

Next, the insulating layers 8 and 9 are formed all over the surface of the layer member 5 and the surface of that region of the semiconductor substrate 1 which is not covered with the layer member 5 as in the case of FIG. 4 (FIGS. 31A and 31B). Thus, the layer member 5' is formed which includes the conductive layer 61 and the insulating layer 12 formed on its side surface 10 and uses the surface of the insulating layer 12 as the insulating side surface 14. Further, the insulating layer 9 is formed to extend from the side surface 14 of the layer member 5' in a direction opposite therefrom.

Thereafter, the insulating layer 9 is selectively removed to form therein the window 17 as is the case with FIG. 5 (FIGS. 32A and 32B). It must be noted that, in this case, the window 16 in FIG. 5 is not formed in the insulating layer 8. In the insulating layer 4 is formed the recess 18 similar to that in the case of FIG. 5.

The formation of the window 17 in the insulating layer 9 is followed by the formation of the conductive layer 19 all over the surfaces of the layer member 5' and the insulating layer 9 (FIG. 33).

Figure 34A:
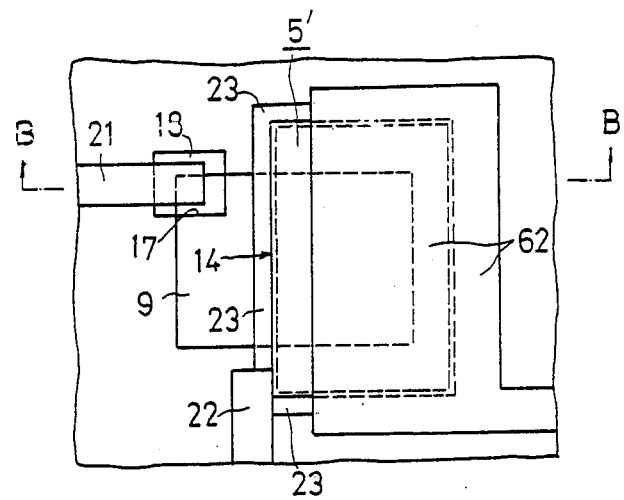
Figure 34B:
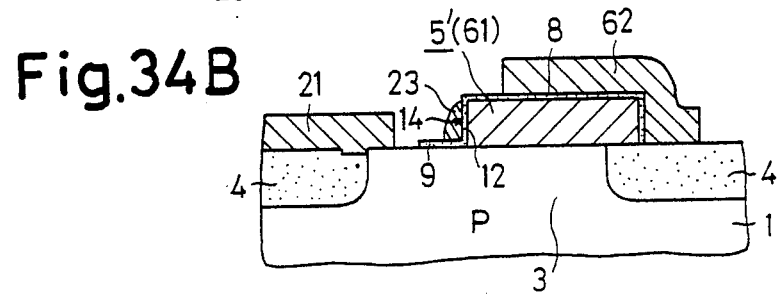
Figure 35:
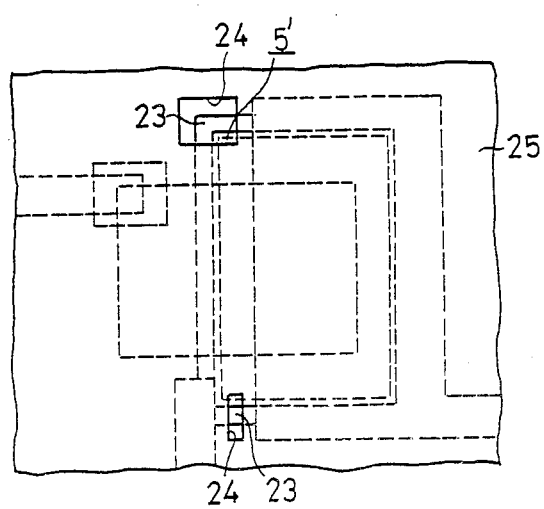

Following this, the conductive layer 19 is selectively etched away using a mask to provide the same conductive layers 21 and 22 as those in FIG. 7 and a conductive layer 62 which covers on the insulating layer 8 of the layer member 5' and extends on the insulating layer 4 in a direction opposite from the layer member 5' (FIGS. 34A and 34B). In this case, there is left on the side surface of the layer member 5' the conductive layer 23 contiguous to the conductive layers 22 and 62 as is the case with FIG. 7.

Figure 9:
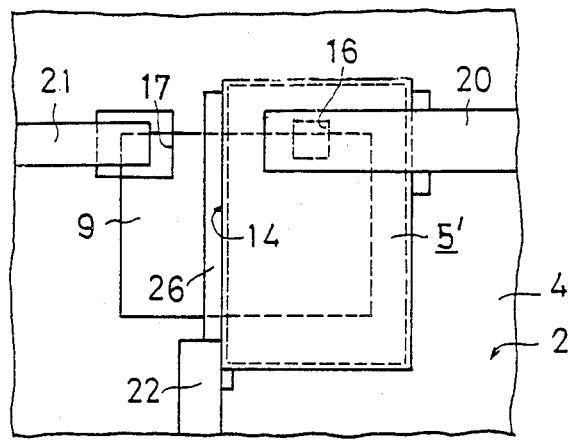

Next, the conductive layer 23 is selectively etched away using the mask 25 (FIG. 35) having the opening 24 for exposing the layer 23 to the outside at a position other than the region of the layer 23 extending on the insulating layer 9 and the region defined between abovesaid region and the conductive layer 22, after which the mask 25 is removed, forming the conductive layer 26 connected with the conductive layer 22 alone as in the case of FIG. 9 (FIG. 36).

Then, N type impurity ions 27 are implanted into the region 3 to form the N type semiconductor region 28 as in the case of FIG. 10 (FIG. 37).

The ion implantation is followed by heat treatment, whereby the same N type semiconductor region 29 as in the case of FIG. 11 is formed in the portion of the region 3 underlying the conductive layer 21 to provide the semiconductor region 30 composed of the semiconductor regions 28 and 29 and the same N type semiconductor region 31 as in the case of FIG. 11 is formed in that portion of the region 3 making contact with the layer member 5' (FIG. 38).

Figure 39A:
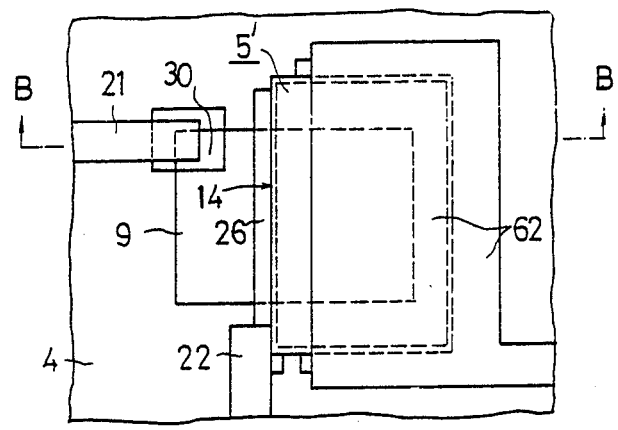
Figure 39B:
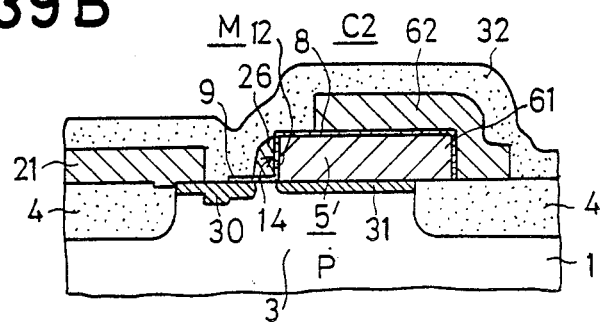

Finally, the same insulating layer 32 as in the case of FIG. 12 is formed to cover the conductive layers 21, 26 and 62 (FIGS. 39A and 39B (In FIG. 39A, however, the insulating layer 32 is omitted)).

In this way, the structure of the third embodiment of the present invention is obtained which is provided with one surface channel type MIS FET and are capacitance element.

Figure 40:
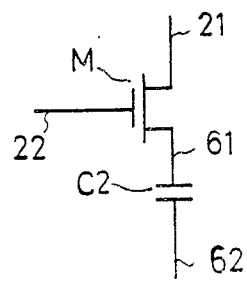
FIG. 40 is an electrical connection diagram of the third embodiment of the semiconductor device of the present invention.

According to the arrangement of the third embodiment of the present invention (FIGS. 39A and 39B), there is constituted a surface channel type MIS FET M similar to that obtainable with the first embodiment. Further, the conductive layer 61 of the layer member 5', the insulating layer 8 and the conductive layer 62 make up a capacitance element C2 connected with the MIS FET M. Accordingly, the MIS FET M and the capacitance element C2 are connected in series with each other as depicted in FIG. 40.

With the arrangement of the third embodiment of the present invention, since the conductive layer 26 is formed on the surface of the insulating layer 9 in contact with the insulating side surface 14 of the layer member 5' as is the case with the first embodiment, the length of the gate electrode of the MIS FET M can be made short but its thickness can be larger than the length. Therefore, the MIS FET M possesses the same features as in the first embodiment. Further, the conductive layer 61 forming the layer member 5' is a component of the capacitance element C2, so that the series-connected structure of the MIS FET M and the capacitance element C2 can be made easily and small in size.

While the foregoing has described the first embodiment of the present invention as being applied to the semiconductor device provided with one surface channel type MIS FET M and one resistance element R2 (FIGS. 1 to 13), the second embodiment of the present invention as being applied to the semiconductor device provided with two bulk channel type MIS FET M1 and M2 (FIGS. 14 to 27) and the third embodiment of the present invention as being applied to the semiconductor device provided with one surface channel type MIS FET M and one capacitance element C2 (FIGS. 28 to 40), it will be evident that the present invention is not limited specifically to the first to third embodiments described in the foregoing.

FIGS. 41 to 70 illustrate fourth to thirty-third embodiments of the present invention based on the foregoing first to third embodiments. In FIGS. 41 to 70, the parts corresponding to those in FIGS. 1 to 12, 14 to 26 and 28 to 39 are identified by the same reference numerals and no detailed description will be repeated.

Figure 41:
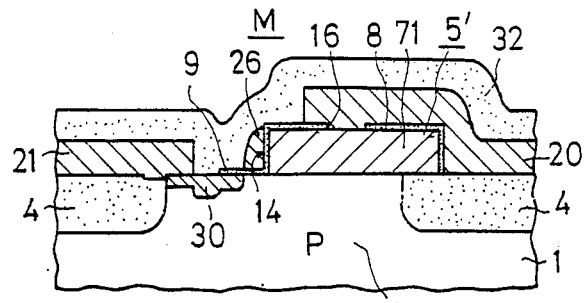
FIGS. 41 to 43 are sectional views schematically showing fourth to sixth embodiments of the present invention as being applied to semiconductor device provided with a surface channel type MIS FET.
Figure 42:
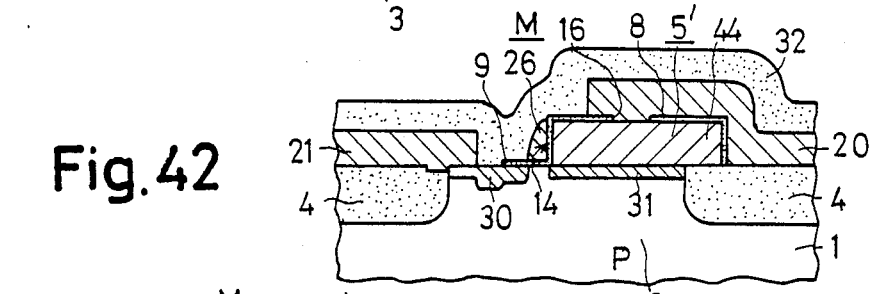
Figure 43:
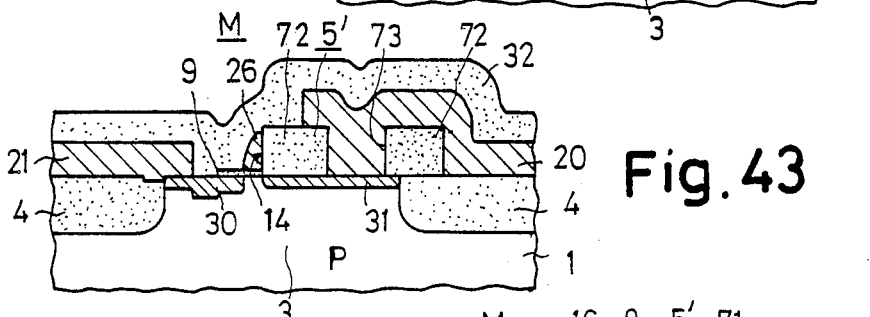

FIGS. 41 to 43 show fourth to sixth embodiments of the invention as being applied to semiconductor devices provided with one surface channel type MIS FET M. In the case of FIG. 41, the layer member 5' is formed by an N type semiconductor layer 71 and the semiconductor region 3 is omitted, so that the semiconductor layer 71 functions as a drain region. In the case of FIG. 42, the layer member 5' is formed by a conductive layer 44. In the case of FIG. 43, the layer member 5' is formed by an insulating layer 72 having a window 73, through which the conductive layer 20 is connected with the semiconductor 31.

Figure 44:
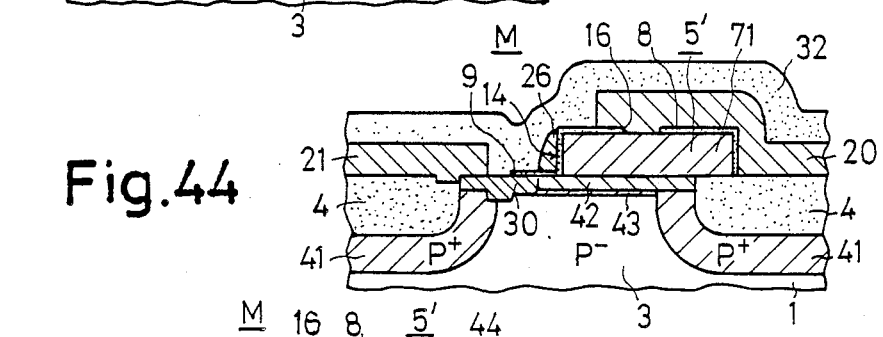
FIGS. 44 to 46 are sectional views schematically showing seventh to ninth embodiments of the present invention as being applied to semiconductor devices provided with a bulk channel type MIS FET.
Figure 45:
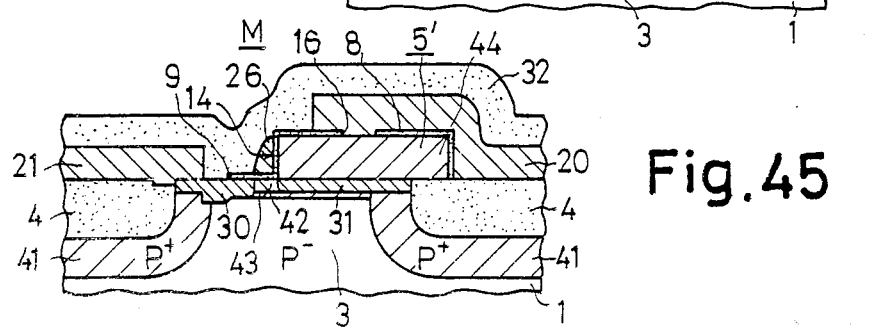
Figure 46:
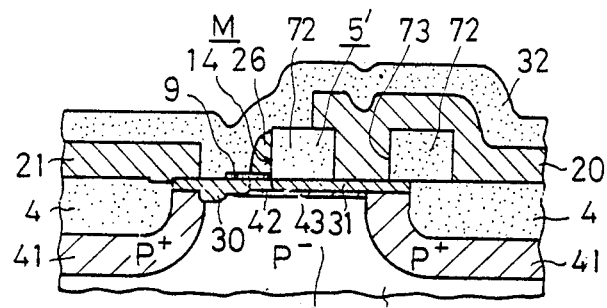

FIGS. 44 to 46 illustrate seventh to ninth embodiments of the present invention each of which has one bulk channel type MIS FET M. In the cases of FIGS. 44, 45 and 46, the layer members 5' are formed by the semiconductor layer 71, the conductive layer 44 and the insulating layer 72 which are the same as those in the cases of FIGS. 41, 42 and 43, respectively, in the case of FIG. 44, the semiconductor region 31 is omitted and, in the case of FIG. 46, the conductive layer 20 is contiguous to the semiconductor 31.

Figure 47:
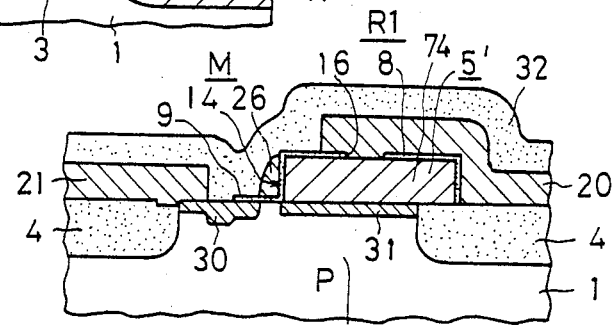
FIGS. 47 and 48 are sectional veiws schematically showing tenth and eleventh embodiment of the present invention as being applied to semiconductor devices provided with a surface channel type MIS FET and a resistance element.
Figure 48:
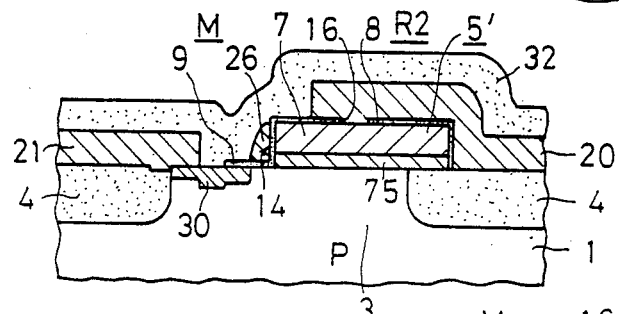

FIG. 47 illustrates a tenth embodiment of the present invention in which the surface channel type MIS FET M and a resistance element R1 are connected in series with each other. FIG. 48 illustrates an eleventh embodiment of the present invention in which the surface channel type MIS FET M and the resistance element R2 are connected in series with each other. In the case of FIG. 47, the layer member 5' is formed by a resistance layer 74 and, in the case of FIG. 48, the layer member 5' is formed by a semiconductor layer 75 on the side of the semiconductor substrate 1 and the resistance layer 7 overlying the semiconductor layer 75 and the semiconductor layer 75 functions as the drain region.

Figure 49:
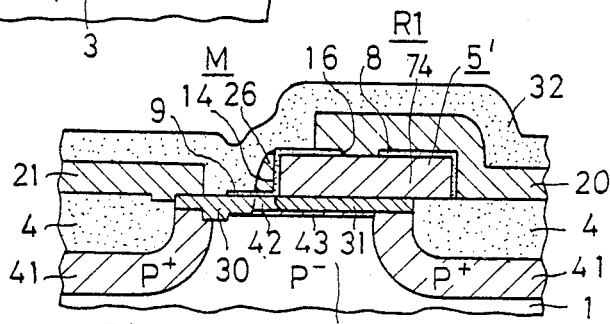
FIGS. 49 to 51 are sectional views schematically showing twelfth to fourteenth embodiments of the prsent invention as being applied to semiconductor devices provided with a bulk channel type MIS FET and a resistance element.
Figure 50:
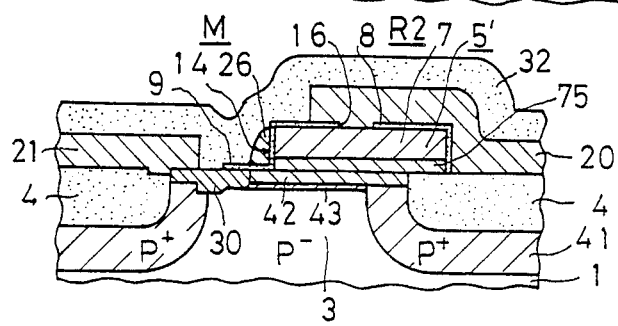
Figure 51:
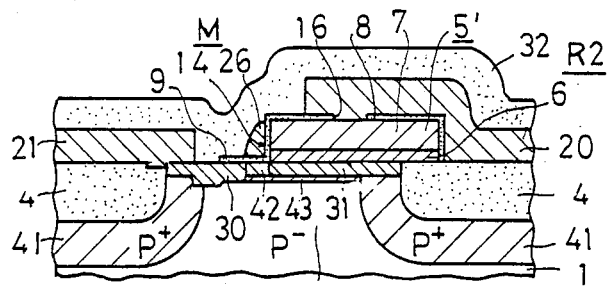

FIG. 49 shows a twelfth embodiment of the present invention in which the bulk channel type MIS FET M and the resistance element R1 are connected in series with each other. FIGS. 50 and 51 show thirteenth and fourteenth embodiments of the present invention in which the bulk channel type MIS FET M and the resistance element R2 are connected in series with each other. In the case of FIG. 49, the layer member 5' is formed by the resistance layer 74 which is the same as in the case of FIG. 47. In the case of FIG. 50, the layer member 5' is composed of the semiconductor layer 75 and the resistance layer 7 which are the same as in the case of FIGS. 48. In the case of FIG. 51, the layer member 5' is composed of the conductive layer 6 and the resistance layer 7.

Figure 52:
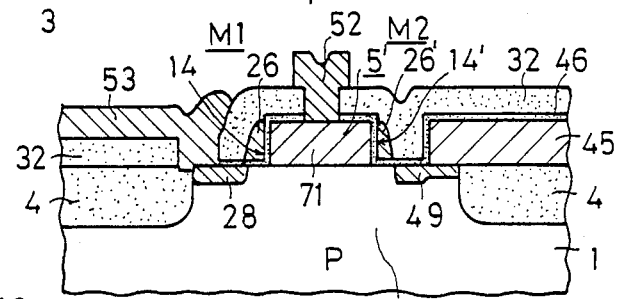
FIGS. 52 to 57 are sectional views schematically showing fifteenth to twentieth embodiments of the present invention as being applied to semiconductor device provided with two surface channel type MIS FETs.
Figure 53:
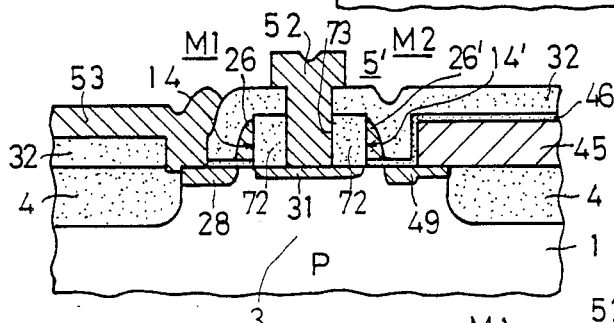
Figure 54:
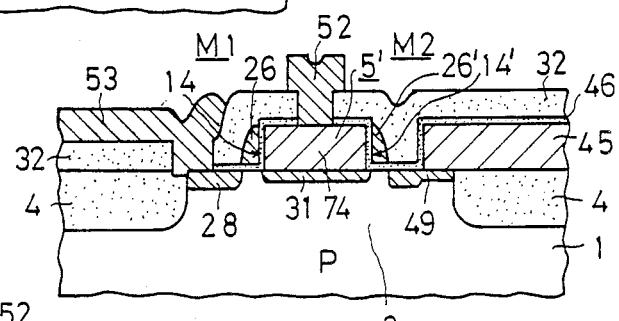
Figure 55:
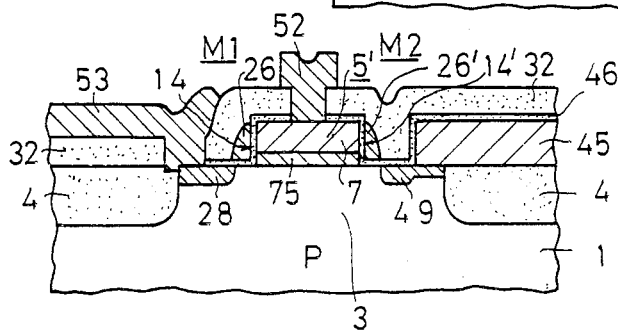
Figure 56:
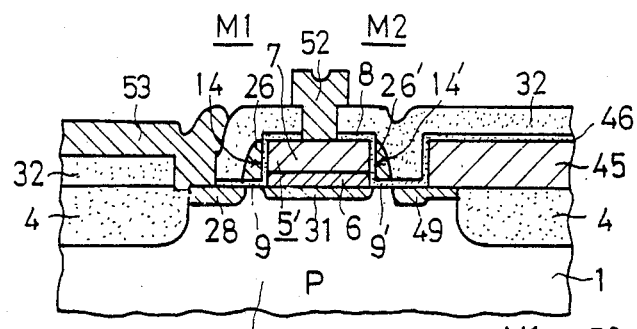
Figure 57:
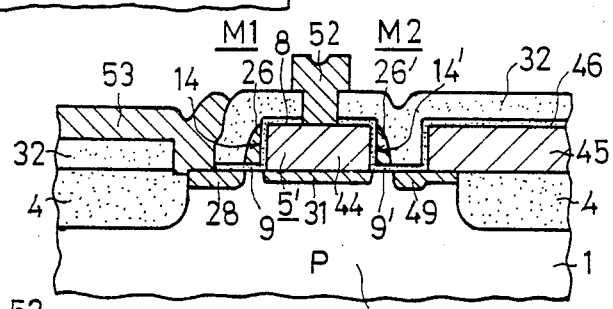
Figure 58:
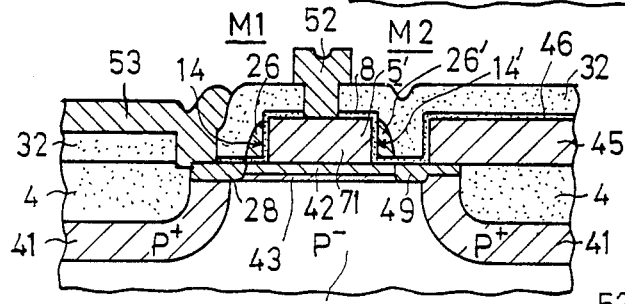
FIGS. 58 to 62 are sectional views schematically showing twenty-first to twenty-fifth embodiments of the present invention as being applied to semiconductor devices provided with two bulk channel type MIS FETs.
Figure 59:
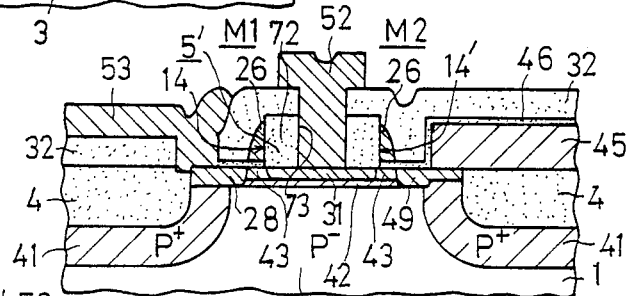
Figure 60:
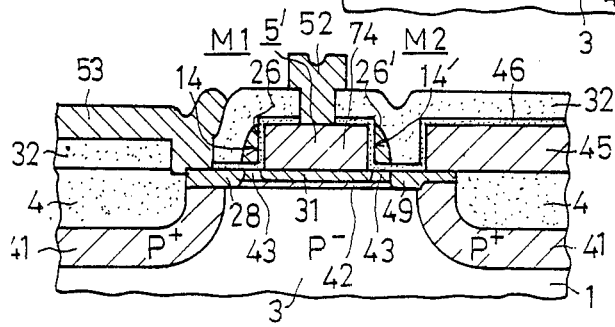
Figure 61:
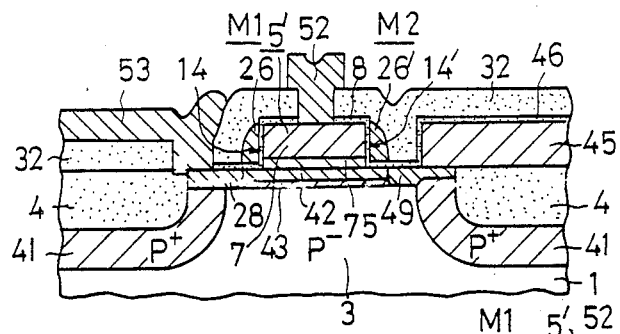
Figure 62:
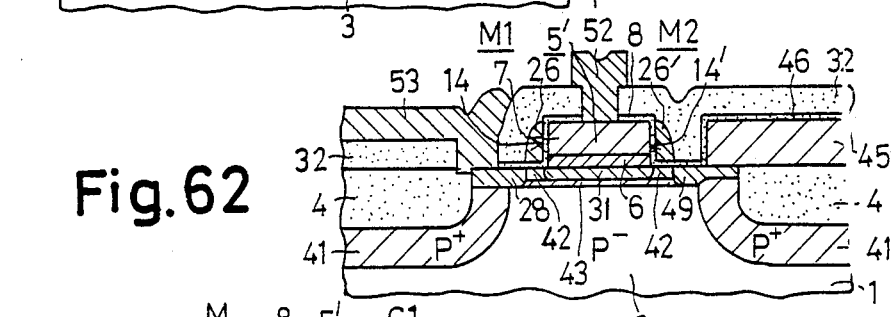

FIGS. 52 to 57 illustrate fifteenth to twentieth embodiments of the present invention which have two surface channel type MIS FETs M1 and M2. In the case of FIG. 52, the layer member 5' is formed by the semiconductor layer 71 which serves as the drain region. In the case of FIG. 53, the layer member 5' is constituted by the insulating layer 72 having the window 73, through which the semi conductive layer 52 is connected with the semiconductor region 31. In the cases of FIGS. 54, 55, 56 and 57, the layer members 5' are formed by the resistance layer 74, the semiconductor layer 75 and the resistance layer 7, the conductive layer 6 and the resistance layer 7, and the conductive layer 44, respectively.

FIGS. 58 to 62 show twenty-first to twenty-fifth embodiments of the present invention which have two bulk channel type MIS FETs M1 and M2. In the cases of FIGS. 58, 59, 60, 61 and 62, the layer members 5' are formed by the semiconductor layer 71, the insulating layer 72, the resistance layer 74, the semiconductor layer 75 and the resistance layer 7, and the conductive layer 6 and the resistance layer 7, respectively.

Figure 63:
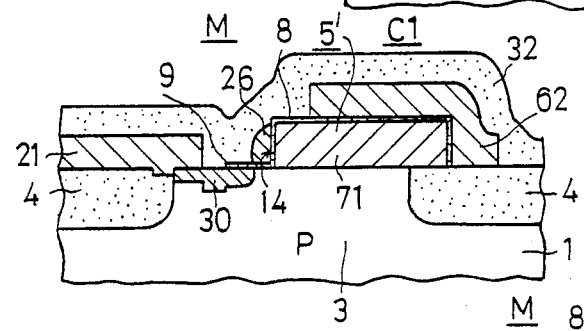
FIG. 63 is a sectional view schematically showing a twenty-sixth embodiment of the present invention as being applied to a semiconductor device provided with a surface channel type MIS FET and a capacitance element.

FIG. 63 illustrates a twenty-sixth embodiment of the present invention which has the surface channel type MIS FET M and capacitance element C1. In this example, the layer member 5' is formed by the semiconductor layer 71 and the capacitance element C1 is constituted by the semiconductor layer 71, the insulating layer 8 and the conductive layer 62.

Figure 64:
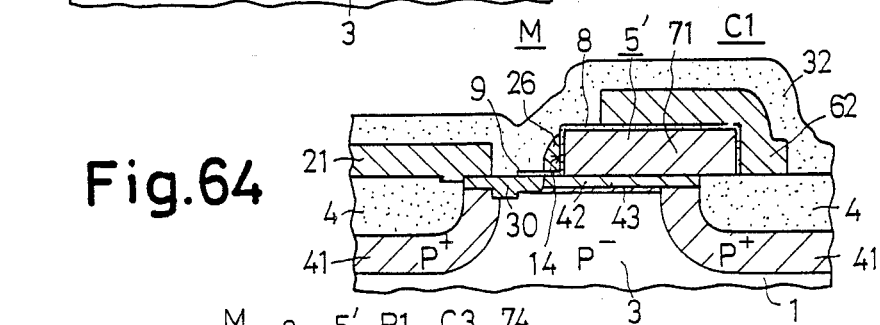
FIG. 64 is a sectional view schematically showing a twenty-seventh embodiment of the present invention as being applied to a semiconductor device provided with a bulk channel type MIS FET and a capacitance element.

FIG. 64 illustrates a twenty-seventh embodiment of the present invention which has the bulk channel type MIS FET M and the capacitance element C1. In this example, the layer member 5' is formed by the semiconductor layer 71.

Figure 65:
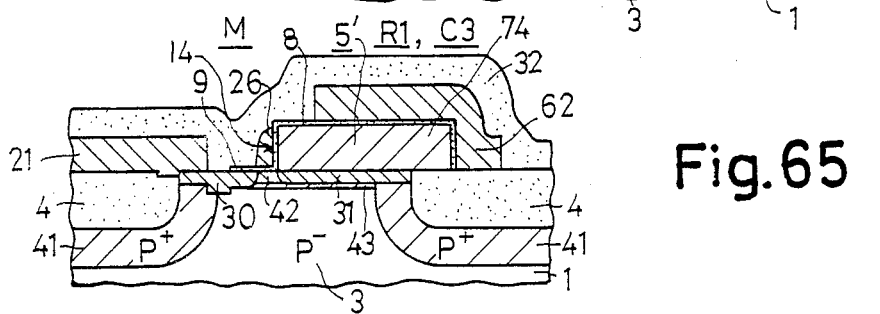
FIGS. 65 to 67 are sectional views schematically showing twenty-eighth to thirtieth embodiments of the present invention as being applied to semiconductor devices provided with a surface channel type MIS FET, a resistance element and a capacitance element.

FIG. 65 shows a twenty-eighth embodiment of the present invention in which the surface channel type MIS FET, the resistance element R1 and a capacitance element C3 connected in series with one another. In this embodiment, the layer member 5' is formed by the resistance layer 74 and the capacitance element C3 is composed of the resistance layer 74, the insulating layer 8 and the conductive layer 62.

Figure 66:
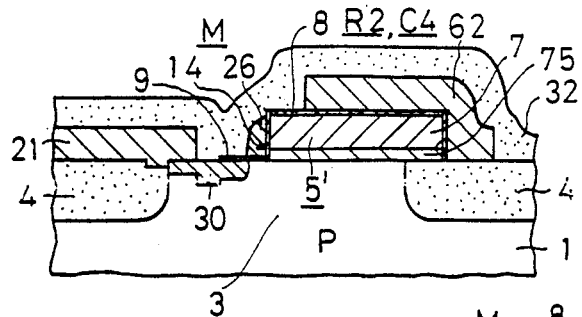
Figure 67:
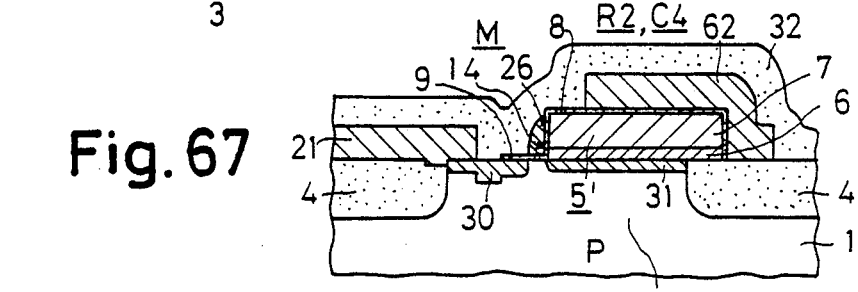

FIGS. 66 and 67 illustrate twenty-ninth and thirtieth embodiment of the present invention in which the surface channel type MIS FET M, the resistance element R2 and a capacitance element C4 are connected in series with one another. In the case of FIG. 66, the layer member 5' is composed of the semiconductor layer 75 and the resistance layer 7. In the case of FIG. 67, the layer member 5' is comprised of the conductive layer 6 and the resistance layer 7 and the capacitance element C4 is formed by the resistance layer 7, the insulating layer 8 and the conductive layer 62.

Figure 68:
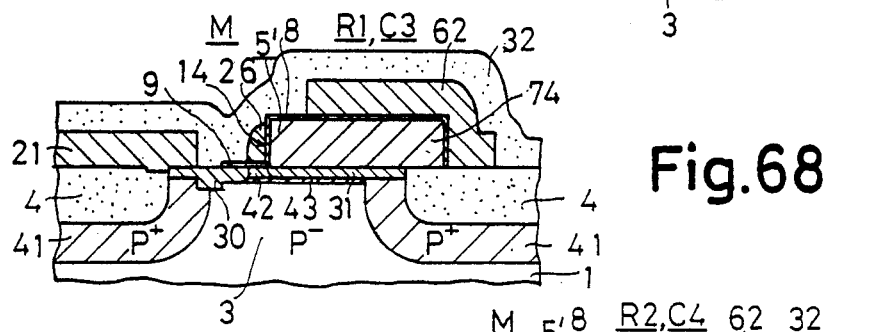
FIGS. 68 to 70 are sectional views schematically showing thirty-first to thirty-third embodiments of the present invention as being applied to semiconductor devices provided with a bulk channel type MIS FET, a resistance element and a capacitance element.

FIG. 68 shows a thirty-first embodiment of the present invention in which the bulk channel type MIS FET, the resistance element R1 and a capacitance element C3 are connected in series with one another. In this embodiment, the layer member 5' is formed by the resistance layer 74 and the capacitance element C3 is composed of the resistance layer 74, the insulating layer 8 and the conductive layer 62.

Figure 69:
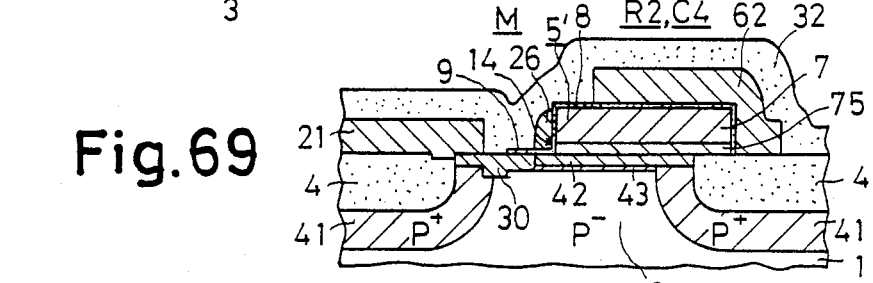
Figure 70:
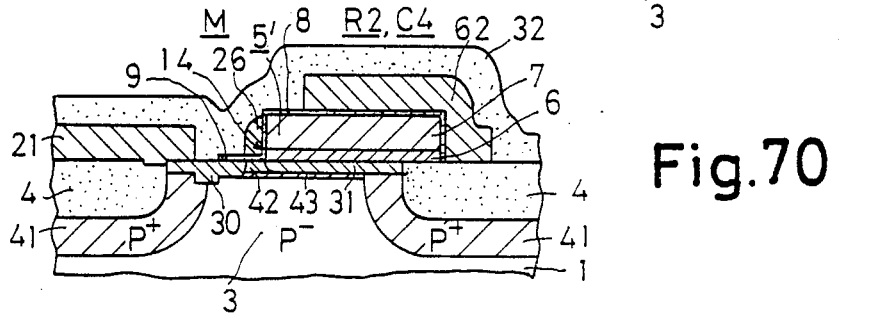

FIGS. 69 and 70 illustrate thirty-second and thirty-third embodiment of the present invention in which the surface channel type MIS FET M, the resistance element R2 and a capacitance element C4 are connected in series with one another. In the case of FIG. 69, the layer member 5' is composed of the semiconductor layer 75 and the resistance layer 7. In the case of FIG. 70, the layer member 5' is comprised of the conductive layer 6 and the resistance layer 7 and the capacitance element C4 is formed by the resistance layer 7, the insulating layer 8 and the conductive layer 62.

The present invention may variously be modified and varied on the basis of the foregoing embodiments. For example, in the case where the layer member 5' is formed including the insulating layer 12 or 12', it is also possible to individually form the insulating layer 12 or 12' and the region of the insulating layer 8 forming the top surface of the layer member 5' so that the former may be formed thickner than the latter. Also it is possible to exchange the abovesaid conductivity types between the N and the P type. Furthermore, the materials used for the respective parts are not limited specifically to the materials mentioned in the foregoing and the respective parts can be formed known various methods without being restricted to those employed in the embodiments.

It will be apparent that any modifications and variations may be effected without departing from the scope of the novel concepts of this invention.

What is claimed is:

1. A semiconductor device comprising:
   a semiconductor substrate of a first conductivity type;
   a layer member formed in a predetermined pattern on the major surface of the semiconductor substrate, the layer member including a first conductive layer formed on the major surface of the semiconductor substrate contained an impurity imparting a second conductivity type reverse from the first conductivity type, first and second insulating layer formed on first and second opposite side surfaces of the first conductive layer to form first and second opposite insulating side surfaces of the layer member, respectively and a third insulating layer formed on a top surface of the first conductive layer in contiguous to the first and second insulating layer and having a window exposing therethrough the first conductive layer;
   fourth and fifth insulating layers formed on the major surface of the semiconductor substrate extending from the first and second insulating side surfaces of the layer member, respectively;
   a second and third conductive layers formed on the surface of the fourth and fifth insulating layer in contact with only the fourth and fifth insulating layers, respectively and the first and second insulating side surfaces of the layer member, respectively, said second and third conductive layers having marginal edges extending upwardly from said fourth and fifth insulating layers, respectively;
   a fourth conductive layer connected to the first conductive layer through the window;
   first and second semiconductor regions of the second conductivity type formed in the semiconductor substrate from the side of its major surface by a implantation of an impurity imparting the second conductivity type using the second and third conductive layers and the layer member as mask and having marginal edges extending downwardly from the major surface such that the latter marginal edges are substantially aligned with the marginal edges of the second and third conductive layers, respectively, the first and second semiconductor regions extending from its marginal edges away from the second and third conductive layers, respectively; and
   a third semiconductor region of the second conductivity type formed in the seminconductor substrate from the side of its major surface by a diffusion of the impurity imparting the second conductivity type from the first conductive layer and underlying the first conductive layer in contact therewith;
   wherein a first insulating gate field effect transistor is constituted using that region of the second conductive layer overlying the semiconductor substrate as it gate electrode, that region of fourth insulating layer underlying the gate electrode as it gate insulating layer, the first and third semiconductor regions as one and the other of its source and drain regions;

wherein a second insulating gate field effect transistor is constituted using that region of the third conductive layer overlying the semiconductor substrate as it gate electrode, that region of fifth insulating layer underlying the gate electrode as it gate insulating layer, the second and third semiconductor regions as one and the other of its source and drain regions; and wherein the fourth conductive layer is constituted a lead connected to the either one of source and drain regions of the first and second insulating gate effect transistors through the first conductive layer.

2. A semiconductor device comprising:

a semiconductor substrate of a first conductivity type;

a layer member formed in a predetermined pattern on the major surface of the semiconductor substrate, the layer member including a semiconductor layer of a second conductivity type reverse from the first conductivity type formed on the major surface of the semiconductor substrate, first and second insulating layer formed on first and second opposite side surfaces of the semiconductor layer to form first and second opposite insulating side surfaces of the layer member, respectively and a third insulating layer formed on a top surface of the semiconductor layer in contiguous to the first and second insulating layer and having a window exposing therethrough the semiconductor layer;

fourth and fifth insulating layer formed on the major surface of the semiconductor substrate extending from the first and second insulating side surfaces of the layer member, respectively;

a first and second conductive layers formed on the surfaces of the fourth and fifth insulating layer in contact with only the fourth and fifth insulating layers, respectively and the first and second insulating side surfaces of the layer member, respectively, said first and second conductive layers having marginal edges extending upwardly from said fourth and fifth insulating layers, respectively;

a third conductive layer connected to the semiconductor layer through the window; and first and second semiconductor regions of the second conductivity type formed in the semiconductor substrate from the side of its major surface by a implantation of an impurity imparting the second conductivity type using the first and second conductive layers and the layer member as mask and having marginal edges extending downwardly from the major surface such that the latter marginal edges are substasntially aligned with the marginal edges of the first and second conductive layers, respectively, the first and second semiconductor regions extending from its marginal edges away from the first and second conductive layers, respectively;

wherein a first insulating gate field effect transistor is constituted using that region of the first conductive layer overlying the semiconductor substrate as it gate electrode, that region of fourth insulating layer underlying the gate electrode as it gate insulating layer, the first semiconductor region and the semiconductor layer as one and the other of its source and drain regions;

wherein a second insulating gate field effect transistor is constituted using that region of the second conductive layer overlying the semiconductor substrate as it gate electrode, that region of fifth insulating layer underlying the gate electrode as it gate insulating layer, the second semiconductor region and the semiconductor layer as one and the other of its source and drain regions; and wherein the third conductive layer is constituted a lead connected to the either one of source and drain regions of the first and second insulating gate effect transistors.

3. A semiconductor device comprising:

a semiconductor substrate of a first conductivity type;

a layer member formed in a predetermined pattern on the major surface of the semiconductor substrate, the layer member including a resistance layer formed on the major surface of the semiconductor substrate contained an impurity imparting a second conductivity type reverse from the first conductivity type, first and second insulating layer formed on first and second opposite side surfaces of the resistance layer to form first and second opposite insulating side surfaces of the layer member, respectively, and a third insulating layer formed on a top surface of the resistance layer in contiguous to the first and second insulating layer and having a window exposing therethrough the resistance layer;

fourth and fifth insulating layer formed on the major surface of the semiconductor substrate extending from the first and second insulating side surfaces of the layer member, respectively;

a first and second conductive layers formed on the surface of the fourth and fifth insulating layer in contact with only the fourth and fifth insulating layers, respectively and the first and second insulating side surfaces of the layer member, respectively, said first and second conductive layers having marginal edges extending upwardly from said fourth and fifth insulating layers, respectively;

a third conductive layer connected to the resistance layer through the window;

first and second semiconductor regions of the second conductivity type formed in the semiconductor substrate from the side of its major surface by a implantation of an impurity imparting the second conductivity type using the first and second conductive layers and the layer member as mask and having marginal edges extending downwardly from the major surfaces such that the latter marginal edges are substantially aligned with the marginal edges of the first and second conductive layers, respectively the first and second semiconductor regions extending from its marginal edges away from the first and second conductive layers, respectively; and a third semiconductor region of the second conductivity type formed in the semiconductor substrate from the side of its major surface by a diffusion of the impurity imparting the second conductivity type from the resistance layer and underlying the resistance layer in contact therewith; wherein a first insulating gate field effect transistor is constituted using that region of the second conductive layer overlying the semiconductor substrate as it gate electrode, that region of fourth insulating layer underlying the gate electrode as it gate insulating layer, the first and third semiconductor regions as one and the other of its source and drain regions;

wherein a second insulating gate field effect transistor is constituted using that region of the third conductive layer overlying the semiconductor substrate as it gate electrode, that region of fifth insulating layer underlying the gate electrode as it gate insulating layer, the second and third semiconductor regions as one and the other of its source and drain regions;

wherein the resistance layer is constituted a resistance element coupled with either one of source and drain regions of the first and second insulating gate field effect transistor; and wherein the third conductive layer is constituted a lead connected to the either one of source and drain regions of the first and second insulating gate effect transistors through the resistance element.

4. A semiconductor device comprising:

a semiconductor substrate of a first conductivity type;

a layer member formed in a predetermined pattern on the major surface of the semiconductor substrate, the layer member including a semiconductor layer of a second conductivity type reverse from the first conductivity type formed on the major surface of the semiconductor substrate, a resistance layer formed on the semconductor layer, first and second insulating layer formed on first and second opposite side surfaces of the semiconductor layer and the resistance layer to form first and second opposite insulating side surface of the layer member, respectively, and a third insulating layer formed on a top surface of the first conductive layer in contiguous to the first and second insulating layer and having a window exposing therethrough the resistance layer;

fourth and fifth insulating layer formed on the major surface of the semiconductor substrate extending from the first and second insulating side surfaces of the layer member, respectively;

a first and second conductive layers formed on the surface of the fourth and fifth insulating layer in contact with only the fourth and fifth insulating layers, respectively and the first and second insulating side surfaces of the layer member, respectively, said first and second conductive layers having marginal edges extending upwardly from said fourth and fifth insulating layers, respectively;

a third conductive layer connected to the resistance layer through the window; and first and second semiconductor regions of the second conductivity type formed in the semiconductor substrate from the side of its major surface by a implantation of an impurity imparting the second conductivity type using the first and second conductive layers and the layer member as mask and having marginal edges extending downwardly from the major surface such that the latter marginal edges are substantially aligned with the marginal edges of the first and second conductive layers, respectively, the first and second semiconductor regions extending from its marginal edges away from the first and second conductive layers, respectively;

wherein a first insulating gate field effect transistor is constituted using that region of the first conductive layer overlying the semiconductor substrate as it gate electrode, that region of fourth insulating layer underlying the gate electrode as it gate insulating layer, the first semiconductor region and the semiconductor layer as one and the other of its source and drain regions;

wherein a second insulating gate field effect transistior is constituted using that region of the second conductive layer overlying the semiconductor substrate as it gate electrode, that region of fifth insulating layer underlying the gate electrode as it gate insulating layer, the second semiconductor region and the semiconductor layer as one and the other of its source and drain regions;

wherein the resistance layer is constituted a resistance element coupled with either one of source and drain regions of the first and second insulating gate field effect transistor; and wherein the third conductive layer is constituted a lead connected to the either one of source and drain regions of the first and second insulating gate effect transistors through the resistance element.

5. A semiconductor device comprising:

a semiconductor substrate of a first conductivity type;

a layer member formed in a predetermined pattern on the major surface of the semiconductor substrate, the layer member including a first conductive layer formed on the major surface of the semiconductor substrate contained an impurity imparting a second conductivity type reverse from the first conductivity type, a resistance element formed on the first conductive layer, first and second insulating layer formed on first and second opposite side surfaces of the first conductive layer and the resistance layer to form first and second opposite insulating side surface of the layer member, respectively; and a third insulating layer formed on a top surface of the first conductive layer in contiguous to the first and second insulating layer and having a window exposing therethrough the first conductive layer;

fourth and fifth insulating layer formed on the major surface of the semiconductor substrate extending from the first and second insulating side surfaces of the layer member, respectively;

a second and third conductive layers formed on the surface of the fourth and fifth insulating layer in contact with only the fourth and fifth insulating layers, respectively and the first and second insulating side surfaces of the layer member, respectively, said second and third conductive layers having marginal edges extending upwardly from said fourth and fifth insulating layers, respectively;

a fourth conductive layer connected to the resistance layer through the window;

first and second semiconductor regions of the second conductivity type formed in the semiconductor substrate from the side of its major surface by a implantation of an impurity imparting the second conductivity type using the second and third conductive layers and the layer member as mask and having marginal edges extending downwardly from the major surface such that the latter marginal edges are substantially aligned with the magrginal edges of the second and third conductive layers, respectively, the first and second semiconductor regions extending from its marginal edges away from the second and third conductive layers, respectively; and a third semiconductor region of the second conductivity type formed in the semiconductor substrate from the side of its major surface by diffusion of the impurity imparting the second conductivity type from the first conductive layer and underlying the first conductive layer in contact therewith;

wherein a first insulating gate field effect transistor is constituted using that region of the second conductive layer overlying the semiconductor substrate as it gate electrode, that region of fourth insulating layer underlying the gate electrode as it gate insulating layer, the first and third semiconductor regions as one and the other of its source and drain regions;

wherein a second insulating gate field effect transistor is constituted using that region of the third conductive layer overlying the semiconductor substrate as it gate electrode, that region of fifth insulating layer underlying the gate electrode as it gate insulating layer, the second and third semiconductor regions as one and the other of its source and drain regions;

wherein the resistance layer is constituted a resistance element coupled with either one of source and drain regions of the first and second insulating gate field effect transistor; and wherein the fourth conductive layer is constituted a lead connected to the either one of source and drain regions of the first and second insulating gate transistors through the resistance element.

* * * * *